(12) United States Patent
Muramatsu

(10) Patent No.: US 8,698,278 B2
(45) Date of Patent: Apr. 15, 2014

(54) COMPONENT-INCORPORATING WIRING BOARD

(75) Inventor: Masaki Muramatsu, Aichi (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 12/933,522

(22) PCT Filed: Mar. 24, 2009

(86) PCT No.: PCT/JP2009/056429
§ 371 (c)(1),
(2), (4) Date: Sep. 20, 2010

(87) PCT Pub. No.: WO2009/119875
PCT Pub. Date: Oct. 1, 2009

(65) Prior Publication Data
US 2011/0018099 A1      Jan. 27, 2011

(30) Foreign Application Priority Data
Mar. 24, 2008   (JP) .................................. 2008-75170

(51) Int. Cl.
*H01L 27/08*      (2006.01)
(52) U.S. Cl.
USPC ........... 257/532; 257/698; 257/700; 257/924; 257/E27.048; 438/617; 438/957
(58) Field of Classification Search
USPC .................. 257/532, 698, 700, 924, E27.048; 438/617, 957
See application file for complete search history.

(56) References Cited

U.S. PATENT DOCUMENTS

| 6,370,013 B1 | 4/2002 | Iino et al. |
| 6,979,890 B2 | 12/2005 | Kambe et al. |

(Continued)

FOREIGN PATENT DOCUMENTS

| JP | 10-209328 | 8/1998 |
| JP | 11-260148 | 9/1999 |

(Continued)

OTHER PUBLICATIONS

International Search Report for PCT/JP2009/056429.

(Continued)

*Primary Examiner* — Lex Malsawma
*Assistant Examiner* — Sheng Zhu
(74) *Attorney, Agent, or Firm* — Stites & Harbison PLLC; Jeffrey A. Haeberlin; Nicolo Davidson

(57) ABSTRACT

An objective is to provide a component-incorporated wiring substrate capable of solving a problem caused by an increase in length of wiring lines that connect a component and a capacitor. A component-incorporated wiring substrate 10 includes a core substrate 11, a first capacitor 301, a wiring laminate portion 31, and a second capacitor 101. An accommodation hole portion 90 of the core substrate 11 accommodates the first capacitor 101 therein, and a component-mounting region 20 is set on a surface 39 of the wiring laminate portion 31. The second capacitor 101 has electrode layers 102, 103 and a dielectric layer 104. The second capacitor 101 is embedded in the wiring laminate portion 31 in such a state that first main surfaces 105, 107 and second main surfaces 106, 108 are in parallel with the surface 39 of the wiring laminate portion 31, and is disposed between the first capacitor 301 and the component-mounting region 20.

11 Claims, 10 Drawing Sheets

(56) References Cited

U.S. PATENT DOCUMENTS

| | | | |
|---|---|---|---|
| 7,002,075 B2* | 2/2006 | Kambe et al. | 174/565 |
| 7,271,476 B2* | 9/2007 | Nishikawa et al. | 257/684 |
| 7,321,495 B2* | 1/2008 | Hayashi et al. | 361/761 |
| 7,336,501 B2* | 2/2008 | Tanaka et al. | 361/766 |
| 7,375,412 B1* | 5/2008 | Palanduz et al. | 257/532 |
| 2006/0131069 A1* | 6/2006 | Shimizu et al. | 174/260 |
| 2006/0133057 A1 | 6/2006 | McGregor et al. | |
| 2006/0272853 A1* | 12/2006 | Muramatsu et al. | 174/262 |
| 2006/0283547 A1* | 12/2006 | Yuri et al. | 156/308.6 |
| 2007/0030628 A1 | 2/2007 | Yamamoto | |
| 2007/0045814 A1* | 3/2007 | Yamamoto et al. | 257/698 |
| 2008/0239685 A1* | 10/2008 | Kawabe et al. | 361/782 |
| 2008/0251285 A1* | 10/2008 | Sato et al. | 174/260 |

FOREIGN PATENT DOCUMENTS

| | | |
|---|---|---|
| JP | 2000-208945 | 7/2000 |
| JP | 2002-271034 | 9/2002 |
| JP | 2005-39217 | 2/2005 |
| JP | 2005-39243 | 2/2005 |

OTHER PUBLICATIONS

Office Action dated Sep. 11, 2012 in corresponding European Patent Application No. 09 725 467.6.

Taiwan Patent Office, Office Action issued in corresponding application 98109445, mailed May 29, 2013.

* cited by examiner

COMPONENT-INCORPORATING WIRING BOARD

TECHNICAL FIELD

The present invention relates to a component-incorporated wiring substrate in which a first capacitor and a second capacitor are incorporated.

BACKGROUND ART

In recent years, semiconductor integrated circuit devices (IC chips) used as microprocessors of computers or the like have greatly advanced in operation speed and functionality. In association with such advancement, the number of terminals tends to increase, and the pitch of terminals tends to become narrower. Generally, a large number of terminals are densely arranged in an array on the bottom surface of an IC chip. Such a group of terminals are flip-chip-connected to a group of terminals on a motherboard. However, since there is a great difference in the pitch of terminals between the group of terminals on the IC chip and the group of terminals on the motherboard, difficulty is encountered in connecting the IC chip directly onto the motherboard. Thus, usually, the IC chip is mounted on a wiring substrate, thereby yielding a package. Then, the package is mounted on the motherboard. In order to reduce noise of the IC chip and to stabilize a power supply voltage, incorporation of a capacitor is conventionally proposed for a wiring substrate used to form a package of such a type (refer to, for example, Patent Documents 1 and 2).

Examples of a capacitor to be incorporated in the above-mentioned wiring substrate include a via-array-type capacitor and a sheet capacitor. The via-array-type capacitor includes a capacitor body having a structure in which internal electrode layers are arranged in layers with individual dielectric layers intervening therebetween, and a plurality of via conductors for establishing electrical communication among the internal electrode layers. The via conductors are arranged in an array. The sheet capacitor has a structure of lamination of an electrode layer and a dielectric layer. In the case of incorporation of a via-array-type capacitor in a wiring substrate, the capacitor makes it easier to achieve high capacitance with a small size and enables stable power supply.

Meanwhile, an IC chip has a processor core (arithmetic processing section) provided therein. Since, in addition to the processor core, various circuit sections; for example, an I/O circuit section and a memory, are provided in the IC chip, individual power supply systems must be set for these circuit sections in future. Thus, in this case, even though a via-array-type capacitor is incorporated in a wiring substrate, the processor core and various circuit sections cannot be operated sufficiently. Accordingly, conceivably, the IC chip fails to exhibit its maximum capability, resulting in a failure to achieve high functionality. In order to cope with this situation, conventionally, there is proposed a package in which a capacitor 411 is incorporated in a wiring substrate 401, and chip capacitors 412 are mounted on a front surface 402 or back surface 403 of the wiring substrate 401 (for example, see FIG. 16). By virtue of the capacitor 411 and the chip capacitors 412, a processor core and various circuit sections provided in an IC chip 413 can be operated sufficiently. Accordingly, the IC chip 413 can exhibit its maximum capability, whereby high functionality becomes easy to achieve.

PRIOR ART DOCUMENT

Patent Document 1: Japanese Patent Application Laid-Open (kokai) No. 2005-39217 (FIG. 3, etc.)

Patent Document 2: Japanese Patent Application Laid-Open (kokai) No. 2005-39243 (FIG. 4, etc.)

DISCLOSURE OF THE INVENTION

Problems to be Solved by the Invention

Even when the chip capacitors 412 are mounted on the front surface 402 of the wiring substrate 401 or when the chip capacitors 412 are mounted on the back surface 403 of the wiring substrate 401, wiring lines that connect the chip capacitors 412 and the IC chip 413 tend to become long. As a result, an inductance component of wiring is apt to increase. Thus, the chip capacitors 412 fail to reliably reduce noise of the IC chip 413, and a power supply voltage fails to be reliably stabilized.

The present invention has been conceived in view of the above-mentioned problem, and an object of the invention is to provide a component-incorporated wiring substrate capable of solving a problem caused by an increase in length of wiring lines that connect a component and a capacitor.

Means for Solving the Problems

Means for solving the above-mentioned problem is a component-incorporated wiring substrate comprising a core substrate having a core main surface and a core back surface and having an accommodation hole portion which opens at least on a side toward the core main surface; a first capacitor which has a capacitor main surface and a capacitor back surface and is accommodated in the accommodation hole portion in such a state that the core main surface and the capacitor main surface face the same side; a wiring laminate portion configured such that interlayer insulation layers and conductor layers are laminated alternatingly on the core main surface, and having a component-mounting region which is set on a surface of the wiring laminate portion and in which a component can be mounted; and a second capacitor which has an electrode layer having a first main surface and a second main surface, and a dielectric layer formed on at least one of the first main surface and the second main surface of the electrode layer, is embedded in the wiring laminate portion in such a state that the first main surface and the second main surface are in parallel with the surface of the wiring laminate portion, and is disposed between the first capacitor and the component-mounting region.

According to the above-mentioned component-incorporated wiring substrate, since the second capacitor is embedded in the wiring laminate portion instead of being mounted on the surface of the component-incorporated wiring substrate, wiring lines that connect the second capacitor and a component mounted in the component-mounting region become short. As a result, an increase in an inductance component of wiring is prevented, thereby solving a problem caused by an increase in length of wiring lines.

The core substrate that partially constitutes the above-mentioned component-incorporated wiring substrate is formed into, for example, the form of a plate having the core main surface and the core back surface located opposite the core main surface, and has the accommodation hole portion for accommodating the first capacitor therein. The accommodation hole portion may be a nonthrough hole which opens only on a side toward the core main surface, or a through hole which opens on both sides toward the core main surface and the core back surface. The first capacitor may be accommodated in the accommodation hole portion in a completely embedded state or in a state in which a portion of the first capacitor projects from the opening of the accommodation hole portion. However, preferably, the first capacitor is accommodated in the accommodation hole portion in a completely embedded state. This can prevent projection of the first capacitor from the opening of the accommodation hole portion. Thus, a surface of the wiring laminate portion in contact with the core main surface can be flat, thereby improving dimensional accuracy of the wiring laminate portion.

No particular limitation is imposed on material used to form the core substrate. However, preferably, the core substrate is mainly made of a polymeric material. Examples of a polymeric material used to form the core substrate include EP resin (epoxy resin), PI resin (polyimide resin), BT resin (bismaleimide-triazine resin), and PPE resin (polyphenylene ether resin). Additionally, there may be used a composite material consisting of any one of these resins, and glass fiber (glass woven fabric or glass nonwoven fabric) or organic fiber, such as polyamide fiber.

The first capacitor has the capacitor main surface and the capacitor back surface. The first capacitor may have any shape. However, preferably, for example, the first capacitor assumes the form of a plate such that the area of the capacitor main surface is greater than that of a capacitor side surface. Through employment of such a form, when the first capacitor is accommodated in the accommodation hole portion, the distance between a wall surface of the accommodation hole and a capacitor side surface of the first capacitor is reduced. Thus, the volume of a resin filler to be charged into the accommodation hole portion can be not so large.

The above-mentioned first capacitor comprises, for example, a capacitor body having the capacitor main surface and the capacitor back surface and having a structure in which power-supply internal electrode layers and grounding internal electrode layers are laminated alternatingly via ceramic dielectric layers. Preferably, the first capacitor is a via-array-type capacitor. Specifically, preferably, the first capacitor comprises a plurality of power-supply via conductors for establishing electrical communication among the power-supply internal electrode layers, a plurality of grounding via conductors for establishing electrical communication among the grounding internal electrode layers, power-supply electrodes in contact with end portions located at least on a side toward the capacitor main surface of the plurality of power-supply via conductors, and grounding electrodes in contact with end portions located at least on the side toward the capacitor main surface of the plurality of grounding via conductors; and the plurality of power-supply via conductors and the plurality of grounding via conductors are arranged in an array. Such a structure lowers inductance of the first capacitor and enables absorption of noise and high-speed power supply for flattening power supply fluctuations.

A sintered body of high-temperature-fired ceramic, such as alumina, aluminum nitride, boron nitride, silicon carbide, or silicon nitride, is preferably used to form the ceramic dielectric layer. Also, a sintered body of low-temperature-fired ceramic, such as glass ceramic formed through addition of inorganic ceramic filler, such as alumina, to borosilicate glass or borosilicate lead glass is preferably used. In this case, according to applications, use of a sintered body of dielectric ceramic, such as barium titanate, lead titanate, or strontium titanate, is also preferred. Use of a sintered body of dielectric ceramic facilitates implementation of a first capacitor having large capacitance.

No particular limitation is imposed on the power-supply internal electrode layer, the grounding internal electrode layer, the power-supply via conductor, the grounding via conductor, the power-supply electrode, and the grounding electrode. However, use of, for example, a metalized conductor is preferred. The metalized conductor is formed through application of a metal-powder-containing conductor paste by a conventionally know method; for example, a metalizing printing process, followed by firing. In the case of forming the metalized conductor and the ceramic dielectric layer by a simultaneous firing process, metal powder contained in the metalized conductor must have a melting point higher than a firing temperature for the ceramic dielectric layer. For example, in the case where a so-called high-temperature-fired ceramic (e.g., alumina) is used to form the ceramic dielectric layer, metal powder contained in the metalized conductor can be of nickel (Ni), tungsten (W), molybdenum (Mo), manganese (Mn), etc., or an alloy thereof. In the case where a low-temperature-fired ceramic (e.g., glass ceramic) is used to form the ceramic dielectric layer, metal powder contained in the metalized conductor can be of copper (Cu), silver (Ag), etc., or an alloy thereof.

The wiring laminate portion that partially constitutes the above-mentioned component-incorporated wiring substrate has a structure in which the interlayer insulation layers mainly made of a polymeric material, and the conductor layers are laminated alternatingly on the core main surface. The wiring laminate portion is formed only on the core main surface. However, a laminate portion having a structure similar to that of the wiring laminate portion may also be formed on the core back surface. Specifically, the component-incorporated wiring substrate may have a main-surface-side wiring laminate portion and a back-surface-side wiring laminate portion, the main-surface-side wiring laminate portion being configured such that main-surface-side interlayer insulation layers and main-surface-side conductor layers are laminated alternatingly on the core main surface, the back-surface-side wiring laminate portion being configured such that back-surface-side interlayer insulation layers and back-surface-side conductor layers are laminated alternatingly on the core back surface. Such a configuration enables formation of an electric circuit not only in the wiring laminate portion formed on the core main surface but also in the laminate portion formed on the core back surface, whereby the functionality of the component-incorporated wiring substrate can be further enhanced.

Material for the interlayer insulation layer can be selected as appropriate in consideration of insulating performance, heat resistance, humidity resistance, etc. Preferred examples of a polymeric material used to form the interlayer insulation layer include thermosetting resins, such as epoxy resin, phenolic resin, polyurethane resin, silicone resin, polyimide resin, bismaleimide-triazine resin, xylene resin, and polyester resin; and thermoplastic resins, such as polycarbonate resin, acrylic resin, polyacetal resin, and polypropylene resin.

The conductor layer can be formed of an electrically conductive metal material. Examples of a metal material used to form the conductor layer include copper, silver, iron, cobalt, and nickel. Particularly preferably, the conductor layer is formed of copper, which has high electrical conductivity and is inexpensive. Preferably, the conductor layer is formed by plating. Through employment of plating, the conductor layer can be readily fowled at low cost. However, the conductor layer may be formed by printing by use of metal paste.

The wiring laminate portion has the component-mounting region set on its surface. A component can be mounted in such a component-mounting region. The "component-mounting region" is located immediately under the lower surface of the mounted component and has substantially the same outline as that of the lower surface of the component. The area of the component-mounting region is set equivalent to or smaller than that of the lower surface of a component. The "component-mounting region" means a region where a plurality of terminals are exposed from the surface of the wiring laminate portion.

Examples of a preferred component include a semiconductor integrated circuit device (IC chip) and an MEMS (Micro Electro Mechanical Systems) device fabricated by a semiconductor fabrication process. Further, examples of an IC chip include a DRAM (Dynamic Random Access Memory) and an SRAM (Static Random Access Memory). The "semiconductor integrated circuit device" means a device which is used mainly as a microprocessor of a computer, or the like.

Preferably, the second capacitor is a sheetlike capacitor having an electrode layer and a dielectric layer and embedded in the wiring laminate portion. Through employment of such a configuration, even when the second capacitor is embedded in the wiring laminate portion, the component-incorporated wiring substrate is unlikely to become thick. The second capacitor can have an arbitrary shape; for example, as viewed in plane, a rectangular shape, a triangular shape, or a circular shape. Particularly preferably, the second capacitor has a rectangular shape as viewed in plane, which is the same as that of an ordinary component-incorporated wiring substrate. The "rectangular shape as viewed in plane" is not limited to a completely rectangular shape as viewed in plane, but encompasses a shape which is chamfered at corners or whose sides are partially curved.

No particular limitation is imposed on thickness of the entire second capacitor. However, the thickness of the entire second capacitor is, for example, 1 µm to 100 µm inclusive, preferably 5 µm to 75 µm inclusive. When the thickness of the entire second capacitor is less than 1 µm, the second capacitor fails to exhibit sufficient strength. Accordingly, difficulty is encountered in handling the second capacitor as a unit. When the thickness of the entire second capacitor is in excess of 100 µm, an increase in density and a reduction in size of the component-incorporated wiring substrate may be hindered. Also, in the case where the second capacitor is incorporated in the component-incorporated wiring substrate, a level difference or step is apt to arise, potentially resulting in a failure to ensure flatness of the substrate surface. As a result, the reliability of connection between the component-incorporated wiring substrate and a component mounted on the substrate surface may deteriorate.

The second capacitor may have a single electrode layer and a single dielectric layer or may have two or more electrode layers and dielectric layers. However, preferably, the number of electrode layers and dielectric layers is small. When the number of electrode layers and dielectric layers is increased, the capacity of the second capacitor can be increased, but an increase in density and a reduction in size (thickness) of the component-incorporated wiring substrate cannot be achieved. Thus, in this case, preferably, the outside dimension of the second capacitor is set greater than that of the first capacitor and that of the component-mounting region, and as viewed from a thickness direction of the component-incorporated wiring substrate, a placement region of the second capacitor encompasses that of the first capacitor and the component-mounting region. Through employment of such a configuration, even when the thickness of the component-incorporated wiring substrate is reduced, high capacity can be imparted to the second capacitor by virtue of the large outside dimension of the second capacitor.

Examples of material used to form the electrode layer include silver, gold, platinum, copper, titanium, aluminum, palladium, nickel, and tungsten. Particularly, nickel, which has relatively high melting point, is preferred. Through employment of nickel, when a dielectric layer is formed of ceramic having a high dielectric constant, the electrode layer and the dielectric layer can be fired simultaneously. Also, since the electrode layer is formed of a relatively inexpensive material, the cost of the second capacitor can be lowered.

It is good practice for the electrode layer to have a thickness of, for example, 0.1 µm to 50 µm inclusive. When the thickness of the electrode layer is less than 0.1 µm, difficulty may be encountered in ensuring electrical reliability. When the thickness of the electrode layer is in excess of 50 µm, the entire second capacitor may become thick. Thus, through employment of a thickness of 0.1 µm to 50 µm inclusive, while electrical reliability is ensured, the entire second capacitor can be prevented from becoming thick.

The dielectric layer that partially constitutes the second capacitor means a layer that contains inorganic matter having a high dielectric constant (e.g., dielectric ceramic) as a main component. Dielectric ceramic means a ceramic having a high dielectric constant (defined as a ceramic having a specific dielectric constant of 10 or greater). For example, a complex oxide having a perovskite-type crystal structure falls under the category of dielectric ceramic. A specific example of such a complex oxide is a compound formed from barium titanate, lead titanate, or strontium titanate, or from a combination thereof.

It is good practice for the dielectric layer to have a thickness of, for example, 0.1 µm to 50 µm inclusive. Preferably, the thickness is 0.5 µm to 20 µm inclusive. A thin dielectric layer is preferable in terms of impartment of high capacity to the second capacitor. However, when the thickness of the dielectric layer is excessively reduced to less than 0.1 µm, in the case of employment of two or more electrode layers, difficulty may be encountered in ensuring insulation between the electrode layers. At the same time, when the thickness of the dielectric layer is in excess of 50 µm, not only is difficulty encountered in achieving high capacity, but also the entire second capacitor may become thick.

In the case where the first capacitor and a plurality of terminals present in the component-mounting region are electrically connected via connection conductors provided in the wiring laminate portion, preferably, the second capacitor has a through hole(s) extending therethrough in a thickness direction thereof, and the connection conductors are disposed in the through hole(s) in noncontact with the wall surface(s) of the through hole(s). Through employment of such a configuration, even when the outside dimension of the second capacitor is increased, electrical connection is reliably established between the first capacitor and a component mounted in the component-mounting region. Notably, in the case where the first capacitor and a plurality of terminals present in the component-mounting region are electrically connected via connection conductors provided in the wiring laminate portion, the configuration may be as follows: a cutout(s) is formed at a peripheral portion of the second capacitor, and the connection conductors are disposed in the cutout(s) in noncontact with the wall surface(s) of the cutout(s). Such a configuration can also yield effects similar to those in the case of formation of the through hole(s) in the second capacitor.

The through hole(s) can be formed by a conventionally known method. Specific examples of such a method include etching, laser machining, cutting, drilling, and punching.

No particular limitation is imposed on the number and shape of the through holes. For example, in the case where a plurality of signal terminals are disposed in a closed loop arrangement at a peripheral portion of the component-mounting region, and the second capacitor is embedded in the wiring laminate portion at a position located toward the surface of the wiring laminate portion, the connection conductors are in the same arrangement as that of the plurality of signal terminals. In this case, preferably, the through hole is formed in a closed loop in such a manner as to positionally coincide with the plurality of signal terminals, and the connection conductors serve as signal wiring lines for electrically connecting the first capacitor and the plurality of signal terminals. In the case where a plurality of signal terminals are disposed in a closed loop arrangement at a peripheral portion of the component-mounting region, and the second capacitor is embedded in the wiring laminate portion at a position located toward the core main surface, the connection conductors are disposed in such a manner as to be spaced apart from one another, since the connection conductors are fanned out. In this case, preferably, a plurality of the through holes are formed in a closed loop arrangement, and the connection conductors serve as signal wiring lines for electrically connecting the first capacitor and the plurality of signal terminals.

In the case where the first capacitor and a plurality of terminals present in the component-mounting region are electrically connected via connection conductors provided in the wiring laminate portion, the configuration may be as follows: a plurality of the second capacitors are embedded in the wiring laminate portion and arranged in such a manner as to avoid positionally overlapping with the connection conductors. Through employment of such a configuration, even when a plurality of second capacitors are embedded, electrical connection is reliably established between the first capacitor and a component mounted in the component-mounting region.

In the case where the component is a semiconductor integrated circuit device having a microprocessor core section, an input section, and an output section, and the component-mounting region comprises a first mounting region connectable to the microprocessor core section, and a second mounting region connectable to the input section or the output section, preferably, the first capacitor and a plurality of first terminals present in the first mounting region are electrically connected via first connection conductors provided in the wiring laminate portion, and the second capacitor and a plurality of second terminals present in the second mounting region are electrically connected via second connection conductors provided in the wiring laminate portion. Through employment of such a configuration, while the first capacitor is electrically connected to the microprocessor core section, the second capacitor can be electrically connected to the input section or the output section. Thus, in the case where, separately from a power supply system for the microprocessor core section, a power supply system for the input section or the output section must be set, the microprocessor core section and the input or output section can be operated sufficiently. Accordingly, even when the internal structure of a component; i.e., a semiconductor integrated circuit device, becomes complex, the semiconductor integrated circuit device can exhibit its maximum capability, whereby high functionality becomes easy to achieve.

Herein, the "input section" is a processing section for processing signals to be input to the microprocessor core section (arithmetic processing section), and the "output section" is a processing section for processing signals to be output from the microprocessor core section.

As mentioned above, the first capacitor can be electrically connected to the microprocessor core section of the semiconductor integrated circuit device, and the second capacitor can be electrically connected to the input section or the output section of the semiconductor integrated circuit device. That is, the first capacitor and the second capacitor can be electrically connected to different processing sections of the semiconductor integrated circuit device. Specifically, the first capacitor is electrically connected to one of a power supply conductor portion and a grounding conductor portion which the microprocessor core section has separately. The second capacitor is electrically connected to one of the power supply conductor portion and the grounding conductor portion which the input section or the output section has separately. The first capacitor and the second capacitor may be electrically connected to each other or electrically independent of each other.

Meanwhile, the microprocessor core section operates in a high frequency band (e.g., gigahertz band), whereas the input section or the output section operates in a frequency band (e.g., megahertz band) lower than that of the microprocessor core. Accordingly, as compared with the input section or the output section, the microprocessor core section must have high operational stability and thus must be connected to a capacitor having a relatively high capacity. By contrast, the input section or the output section does not necessarily have such high operational stability, and connection to a capacitor having a relatively low capacity suffices for the input section or the output section.

The second mounting region may be for input use only or for output use only, or may be for input and output use. That is, the second capacitor may have an input electrode layer and an output electrode layer, allowing electrical connection of the input electrode layer to the input section and electrical connection of the output electrode layer to the output section.

In the case where a component-mounting portion in which a surface-mounting component can be mounted is set on a surface of the main-surface-side wiring laminate portion or a surface of the back-surface-side wiring laminate portion, the component is a semiconductor integrated circuit device having a microprocessor core section, an input section, and an output section, and the component-mounting region comprises a first mounting region connectable to the microprocessor core section, and a second mounting region connectable to the input section or the output section, the first capacitor and the second capacitor may be electrically connected to a plurality of first terminals present in the first mounting region via first connection conductors provided in the wiring laminate portion, and connection terminals present in the component-mounting portion and a plurality of second terminals present in the second mounting region are electrically connected via second connection conductors provided in at least one of the main-surface-side wiring laminate portion and the back-surface-side wiring laminate portion. Through employment of such a configuration, while the first capacitor and the second capacitor are electrically connected to the microprocessor core section, the surface-mounting component can be electrically connected to the input section or the output section. Thus, in the case where, separately from a power supply system for the microprocessor core section, a power supply system for the input section or the output section must be set, the microprocessor core section and the input or output section can be operated sufficiently. Accordingly, even when the internal structure of a component; i.e., a semiconductor integrated circuit device, becomes complex, the semiconductor integrated circuit device can exhibit its maximum capability, whereby high functionality becomes easy to achieve.

MODES FOR CARRYING OUT THE INVENTION

A component-incorporated wiring substrate according to an embodiment of the present invention will be described in detail with reference to the drawings.

Figure 1:
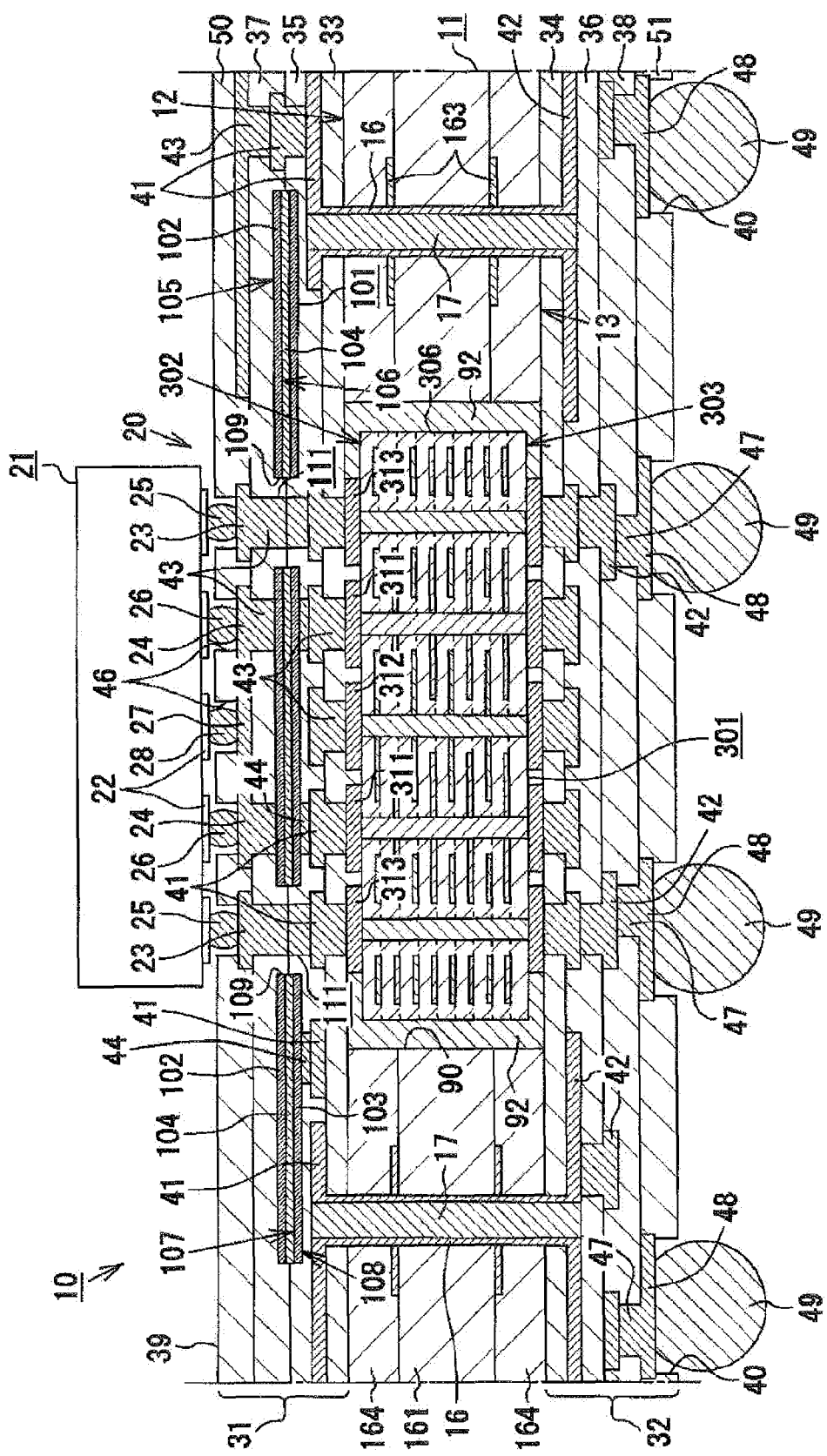
[FIG. 1] Schematic sectional view showing a wiring substrate according to an embodiment of the present invention.

As shown in FIG. 1, a component-incorporated wiring substrate (hereinafter referred to as "wiring substrate") 10 of the present embodiment is a wiring substrate for mounting an IC chip thereon. The wiring substrate 10 includes a core substrate 11 having a substantially rectangular shape; a main-surface-side buildup layer 31 (main-surface-side wiring laminate portion) formed on a core main surface 12 (upper surface in FIG. 1) of the core substrate 11; and a back-surface-side buildup layer 32 (back-surface-side wiring laminate portion) formed on a core back surface 13 (lower surface in FIG. 1) of the core substrate 11.

The core substrate 11 of the present embodiment has a substantially rectangular shape as viewed in plane, measuring 25 mm length×25 mm width×1.0 mm thickness. The core substrate 11 has a thermal expansion coefficient of about 10 ppm/° C. to 30 ppm/° C. (specifically, 18 ppm/° C.) in planar directions (XY directions). The thermal expansion coefficient of the core substrate 11 is an average of values measured in a temperature range of 0° C. to the glass transition temperature (Tg). The core substrate 11 includes a base material 161 Ruined of glass epoxy; sub base materials 164 formed of epoxy resin to which inorganic filler such as silica filler is added, and formed on the upper and lower surfaces of the base material 161; and conductor layers 163 formed of copper and formed on the upper and lower surfaces of the base material 161. The core substrate 11 has a plurality of through-hole conductors 16 formed therein in such a manner as to extend through the core main surface 12, the core back surface 13, and the conductor layers 163. The through-hole conductors 16 establish connection and electrical communication between a side toward the core main surface 12 of the core substrate 11 and a side toward the core back surface 13 of the core substrate 11 and are electrically connected to the conductor layers 163. The interiors of the through-hole conductors 16 are filled with blocking bodies 17; for example, epoxy resin. Further, the core substrate 11 has a single accommodation hole portion 90 having a rectangular shape as viewed in plane, and opening at a central portion of the core back surface 13 and at a central portion of the core main surface 12. That is, the accommodation hole portion 90 is a through hole.

Figure 2:
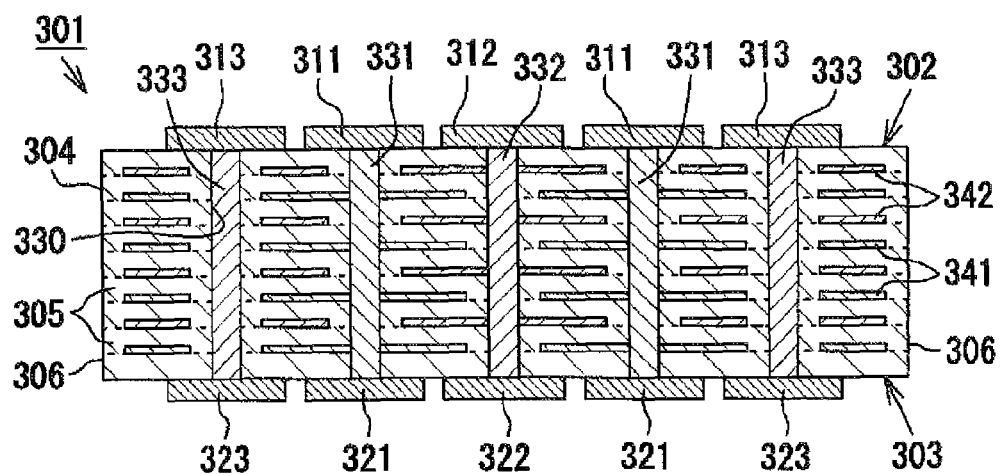
[FIG. 2] Schematic sectional view showing a first capacitor.

As shown in FIG. 1, the accommodation hole portion 90 accommodates a first capacitor 301 shown in FIG. 2, etc. in an embedded condition. The first capacitor 301 is accommodated in such a state that the core main surface 12 of the core substrate 11 and a capacitor main surface 302 face the same side. The first capacitor 301 of the present embodiment is a platelike element having a rectangular shape as viewed in plane and measuring 14.0 mm length×14.0 mm width×0.8 mm thickness.

As shown in FIGS. 1, 2, etc., the first capacitor 301 of the present embodiment is a so-called via-array-type capacitor. A ceramic sintered body 304 (capacitor body) that partially constitutes the first capacitor 301 has a thermal expansion coefficient of about 8 ppm/° C. to 12 ppm/° C., specifically about 9.5 ppm/° C. The thermal expansion coefficient of the ceramic sintered body 304 is an average of values measured in a temperature range of 30° C. to 250° C. The ceramic sintered body 304 has a single capacitor main surface 302 (upper surface in FIG. 1), a single capacitor back surface 303 (lower surface in FIG. 1), and four capacitor side surfaces 306. The ceramic sintered body 304 has a structure in which power-supply internal electrode layers 341 and grounding internal electrode layers 342 are laminated alternatingly via ceramic dielectric layers 305. The ceramic dielectric layers 305 are formed of a sintered body of barium titanate, which is a ceramic having a high dielectric constant, and function as dielectrics between the power-supply internal electrode layers 341 and the grounding internal electrode layers 342. The power-supply internal electrode layers 341 and the grounding internal electrode layers 342 are formed from nickel as a main component and are arranged as every other layer in the interior of the ceramic sintered body 304.

As shown in FIGS. 1 and 2, the ceramic sintered body 304 has a large number of via holes 330. The via holes 330 extend through the ceramic sintered body 304 in the thickness direction of the ceramic sintered body 304 and are arranged in an array (e.g., lattice). A plurality of via conductors 331, 332, 333 are formed from nickel as a main material in the via holes 330 in such a manner as to extend between the capacitor main surface 302 and the capacitor back surface 303 of the ceramic sintered body 304. The power-supply via conductors 331 extend through the power-supply internal electrode layers 341 and electrically connect the power-supply internal electrode layers 341 together. The grounding via conductors 332 extend through the grounding internal electrode layers 342 and electrically connect the grounding internal electrode layers 342 together. The power-supply via conductors 331, the grounding via conductors 332, and the signal via conductors 333 are arranged in an array. In the present embodiment, for convenience of explanation, the via conductors 331, 332, and 333 are illustrated in an array of a 5 rows×5 columns. However, in actuality, more rows and columns are present.

As shown in FIG. 2, etc., a plurality of main-surface-side power-supply electrodes 311 (power-supply electrodes), a plurality of main-surface-side grounding electrodes 312 (grounding electrodes), and a plurality of main-surface-side signal electrodes 313 are provided in a projecting condition on the capacitor main surface 302 of the ceramic sintered body 304. The main-surface-side power-supply electrodes 311 are connected directly to end surfaces of a plurality of the power-supply via conductors 331 located on a side toward the capacitor main surface 302; the main-surface-side grounding electrodes 312 are connected directly to end surfaces of a plurality of the grounding via conductors 332 located on the side toward the capacitor main surface 302; and the main-surface-side signal electrodes 313 are connected directly to end surfaces of a plurality of the signal via conductors 333 located on the side toward the capacitor main surface 302. Also, a plurality of back-surface-side power-supply electrodes 321 (power-supply electrodes), a plurality of back-surface-side grounding electrodes 322 (grounding electrodes), and a plurality of back-surface-side signal electrodes 323 are provided in a projecting condition on the capacitor back surface 303 of the ceramic sintered body 304. The back-surface-side power-supply electrodes 321 are connected directly to end surfaces of a plurality of the power-supply via conductors 331 located on a side toward the capacitor back surface 303; the back-surface-side grounding electrodes 322 are connected directly to end surfaces of a plurality of the grounding via conductors 332 located on the side toward the capacitor back surface 303; and the back-surface-side signal electrodes 323 are connected directly to end surfaces of a plurality of the signal via conductors 333 located on the side toward the capacitor back surface 303. Accordingly, the power-supply electrodes 311, 321 electrically communicate with the power-supply via conductors 331 and the power-supply internal electrode layers 341, and the grounding electrodes 312, 322 electrically communicate with the grounding via conductors 332 and the grounding internal electrode layers 342. The signal electrodes 313, 323 electrically communicate with the signal via conductors 333 only. The electrodes 311-313, 321-323 are formed from nickel as a main material and are coated with unillustrated respective copper plating layers.

For example, when, through application of electricity from a motherboard side via the electrodes 321, 322, voltage is applied between the power-supply internal electrode layers 341 and the grounding internal electrode layers 342, positive charges, for example, are accumulated on the power-supply internal electrode layers 341, and negative charges, for example, are accumulated on the grounding internal electrode layers 342. As a result, the first capacitor 301 functions as a capacitor. In the ceramic sintered body 304, the power-supply via conductors 331 and the grounding via conductors 332 are arranged adjacent to each other. Such an arrangement reduces an inductance component.

As shown in FIG. 1, etc., a gap between the accommodation hole portion 90 and the first capacitor 301 is filled with a resin filler 92 of a polymeric material (in the present embodiment, epoxy resin, which is a thermosetting resin). The resin filler 92 has a function of fixing the first capacitor 301 to the core substrate 11. The first capacitor 301 has a substantially square shape as viewed in plane and is chamfered at four corners with a chamfering dimension of 0.55 mm or greater (in the present embodiment, a chamfering dimension of 0.6 mm). Since such chamfering can mitigate stress concentration on corner portions of the first capacitor 301, cracking in the resin filler 92 can be prevented.

As shown in FIG. 1, the main-surface-side buildup layer 31 formed on the core main surface 12 of the core substrate 11 has a structure in which three main-surface-side interlayer insulation layers 33, 35, 37 of thermosetting resin (epoxy resin), and main-surface-side conductor layers 41 of copper are laminated alternatingly. In the present embodiment, the main-surface-side buildup layer 31 has a thermal expansion coefficient of about 10 ppm/° C. to 60 ppm/° C. (specifically, about 20 ppm/° C.). The thermal expansion coefficient of the main-surface-side buildup layer 31 is an average of values measured in a temperature range of 30° C. to the glass transition temperature (Tg). Via conductors 43 are foamed by copper plating in the main-surface-side interlayer insulation layers 33, 35, 37. Further, via conductors 44 are provided in the main-surface-side interlayer insulation layer 35, the via conductors 44 being formed of hardened matter of copper paste, which is an electrically conductive paste. Upper ends of the through-hole conductors 16 are electrically connected to portions of the main-surface-side conductor layer 41 present on the surface of the first main-surface-side interlayer insulation layer 33. Some of the via conductors 43 provided in the main-surface-side interlayer insulation layer 33 are connected to the electrodes 311-313 of the first capacitor 301.

As shown in FIG. 1, a plurality of terminal pads (specifically, signal terminal pads 23, power-supply terminal pads 24, and grounding terminal pads 27) that partially constitute first terminals are formed on the surface of the third main-surface-side interlayer insulation layer 37. Also, a plurality of terminal pads (specifically, an input-side power-supply terminal pad, an input-side grounding terminal pad, an output-side power-supply terminal pad, and an output-side grounding terminal pad) that partially constitute second terminals are formed on the surface of the main-surface-side interlayer insulation layer 37. Further, substantially the entire surface of the main-surface-side interlayer insulation layer 37 is covered with solder resist 50. The solder resist 50 has opening portions 46 formed at predetermined positions for exposing the above-mentioned terminal pads therethrough. Signal solder bumps 25 that partially constitute the first terminals are disposed on the surfaces of the signal terminal pads 23; power-supply solder bumps 26 that partially constitute the first terminals are disposed on the surfaces of the power-supply terminal pads 24; and grounding solder bumps 28 that partially constitute the first terminals are disposed on the surfaces of the grounding terminal pads 27. Also, an input-side power-supply solder bump (not shown) that partially constitutes a second terminal is disposed on the surface of the input-side power-supply terminal pad, and an input-side grounding solder bump (not shown) that partially constitutes a second terminal is disposed on the surface of the input-side grounding terminal pad. Further, an output-side power-supply solder bump (not shown) that partially constitutes a second terminal is disposed on the surface of the output-side power-supply terminal pad, and an output-side grounding solder bump (not shown) that partially constitutes a second terminal is disposed on the surface of the output-side grounding terminal pad.

As shown in FIG. 1, the solder bumps (the signal solder bumps 25, the power-supply solder bumps 26, the grounding solder bumps 28, the input-side power-supply solder bump, the input-side grounding solder bump, the output-side power-supply solder bump, and the output-side grounding solder bump) are electrically connected to surface connection terminals 22 of an IC chip 21 (semiconductor integrated circuit device). The IC chip 21 of the present embodiment is a plate-like device having a rectangular shape as viewed in plane, measuring 12.0 mm length×12.0 mm width×0.9 mm thickness. The IC chip 21 is formed of silicon having a thermal expansion coefficient of about 3 ppm/° C. to 4 ppm/° C. (specifically, about 3.5 ppm/° C.). The IC chip 21 has a microprocessor core section 61, an input section 62, and an output section 63 (see FIG. 3). Notably, a region where the above-mentioned first and second terminals are present is a component-mounting region 20 in which the IC chip 21 can be mounted. The component-mounting region 20 is set on a surface 39 of the main-surface-side buildup layer 31 and has a rectangular shape as viewed in plane, measuring 12.0 mm length×12.0 mm width. The component-mounting region 20 consists of a first mounting region 64 in which the first terminals are present and can be connected to the microprocessor core section 61, and a second mounting region 65 in which the second terminals are present and can be connected to the input section 62 and to the output section 63.

As shown in FIG. 1, the back-surface-side buildup layer 32 formed on the core back surface 13 of the core substrate 11 has substantially the same structure as that of the above-mentioned main-surface-side buildup layer 31. Specifically, the back-surface-side buildup layer 32 has a structure in which three back-surface-side interlayer insulation layers 34, 36, 38 having a thermal expansion coefficient of about 10 ppm/° C. to 60 ppm/° C. (specifically, about 20 ppm/° C.) and formed of thermosetting resin (epoxy resin), and back-surface-side conductor layers 42 are laminated alternatingly. Via conductors 47 are formed by copper plating in the back-surface-side interlayer insulation layers 34, 36, 38. Lower ends of the through-hole conductors 16 are electrically connected to portions of the back-surface-side conductor layer 42 present on the lower surface of the first back-surface-side interlayer insulation layer 34. Further, a plurality of BGA pads 48 are formed in a lattice arrangement on the lower surface of the third back-surface-side interlayer insulation layer 38 and are electrically connected to the back-surface-side conductor layers 42 via the via conductors 47. Further, substantially the entire lower surface of the back-surface-side interlayer insulation layer 38 is covered with solder resist 51. The solder resist 51 has opening portions 40 formed at predetermined positions for exposing the BGA pads 48 therethrough. A plurality of solder bumps 49 are disposed on the surfaces of the BGA pads 48 for establishing electrical connection to an unillustrated motherboard. The wiring substrate 10 shown in FIG. 1 is mounted on the unillustrated motherboard by means of the solder bumps 49.

Figure 3:
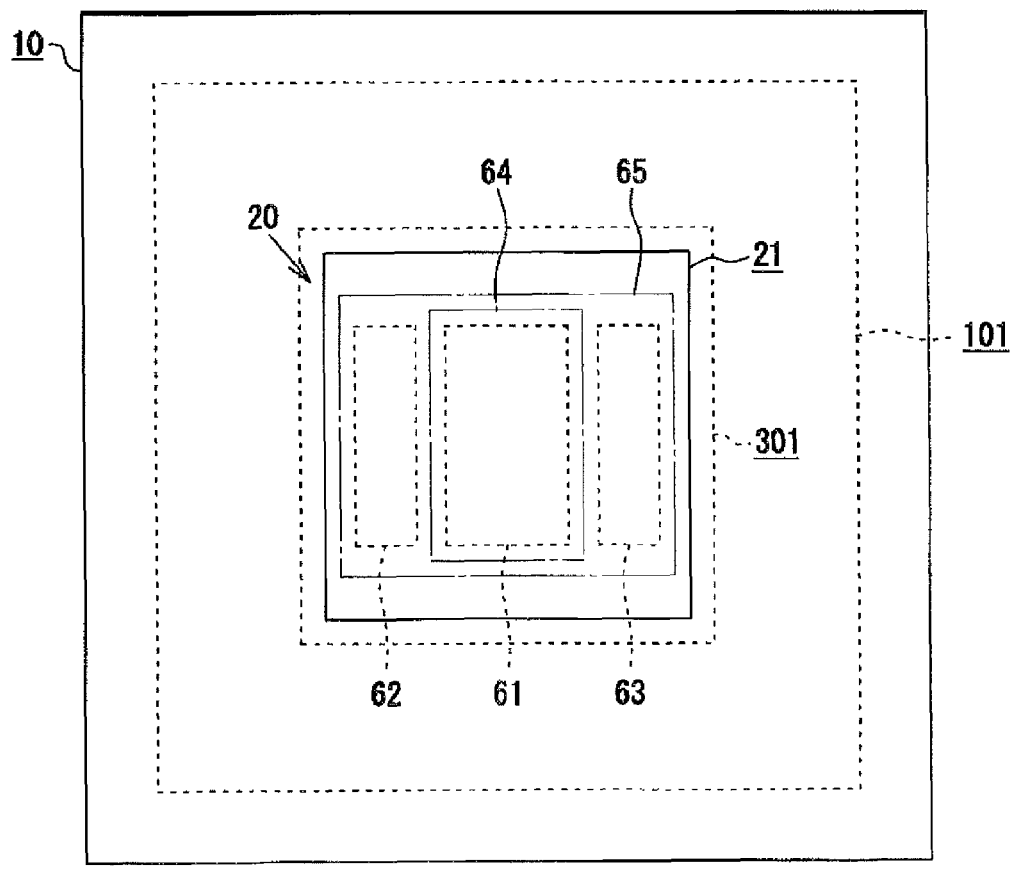
[FIG. 3] Explanatory view showing a positional relation among the first capacitor, a second capacitor, an IC chip, etc.

As shown in FIGS. 1 and 3, a second capacitor 101 is embedded in the interface between the adjacent main-surface-side interlayer insulation layers 35, 37 in the main-surface-side buildup layer 31. The second capacitor 101 of the present embodiment is a sheetlike capacitor having a rectangular shape as viewed in plane, measuring 24.0 mm length× 24.0 mm width×0.02 mm thickness. That is, the outside dimension of the second capacitor 101 is set greater than that of the first capacitor 301 and that of the component-mounting region 20. Also, as viewed from the thickness direction of the wiring substrate 10, the placement region of the second capacitor 101 encompasses that of the first capacitor 301 and the component-mounting region 20 (see FIG. 3). In other words, the second capacitor 101 is disposed between the first capacitor 301 and the component-mounting region 20. The component-mounting region 20 is located immediately above the first capacitor 301 and the second capacitor 101.

As shown in FIG. 1, the second capacitor 101 has a structure in which a single dielectric layer 104 of barium titanate is sandwiched between two nickel electrode layers 102, 103. In the present embodiment, each of the first nickel electrode layer 102 and the second nickel electrode layer 103 has a thickness of 8 μm, and the dielectric layer 104 has a thickness of 4 μm. The dielectric layer 104 has a thermal expansion coefficient of less than 15 ppm/° C., specifically about 12 ppm/° C. to 13 ppm/° C. The thermal expansion coefficient of the dielectric layer 104 is an average of values measured in a temperature range of 30° C. to 250° C.

The first nickel electrode layer 102 has a first main surface 105 and a second main surface 106 disposed in parallel with the surface 39 of the main-surface-side buildup layer 31. The first main surface 105 of the first nickel electrode layer 102 is in surface contact with the main-surface-side interlayer insulation layer 37, and the dielectric layer 104 is formed on the second main surface 106 of the first nickel electrode layer 102. The first nickel electrode layer 102 is electrically connected to the power-supply terminal pads 24 and the grounding terminal pads 27 via the via conductors 43 provided in the main-surface-side buildup layer 31. Also, the first nickel electrode layer 102 is electrically connected to the input-side power-supply terminal pad, the input-side grounding terminal pad, the output-side power-supply terminal pad, and the output-side grounding terminal pad via the via conductors 43 provided in the main-surface-side buildup layer 31.

As shown in FIG. 1, the second nickel electrode layer 103 has a first main surface 107 and a second main surface 108 disposed in parallel with the surface 39 of the main-surface-side buildup layer 31. The dielectric layer 104 is formed on the first main surface 107 of the second nickel electrode layer 103, and the second main surface 108 of the second nickel electrode layer 103 is in surface contact with the main-surface-side interlayer insulation layer 35. The second nickel electrode layer 103 is connected to the upper end surfaces of the via conductors 44 provided in the main-surface-side interlayer insulation layer 35, and the via conductors 44 connected to the second nickel electrode layer 103 are connected to the electrodes 311, 312 of the first capacitor 301. That is, the first capacitor 301 and the second capacitor 101 are electrically connected to each other.

When, through application of electricity to the thus-configured second capacitor 101, voltage is applied between the first nickel electrode layer 102 and the second nickel electrode layer 103, positive charges are accumulated on one electrode layer, and negative charges are accumulated on the other electrode layer.

As shown in FIG. 1, the second capacitor 101 has a plurality of through holes 109 extending therethrough in the thickness direction thereof. No particular limitation is imposed on the shape of the through holes 109. In the present embodiment, the through holes 109 have a circular shape as viewed from the thickness direction of the second capacitor 101. Portions of the main-surface-side interlayer insulation layers 35, 37 intrude into the through holes 109.

Signal wiring lines 111 (first connection conductors), an input-side power-supply wiring line (second connection conductor), an input-side grounding wiring line (second connection conductor), an output-side power-supply wiring line (second connection conductor), and an output-side grounding wiring line (second connection conductor) are disposed in the through holes 109. The signal wiring lines 111, the input-side power-supply wiring line, the input-side grounding wiring line, the output-side power-supply wiring line, and the output-side grounding wiring line are provided in the main-surface-side buildup layer 31 and are disposed in noncontact with the wall surfaces of the through holes 109. The main-surface-side conductor layers 41 and the via conductors 43 form the signal wiring lines 111, the input-side power-supply wiring line, the input-side grounding wiring line, the output-side power-supply wiring line, and the output-side grounding wiring line. The signal wiring lines 111 establish electrical connection between the main-surface-side signal electrodes 313 of the first capacitor 301 and the first terminals (the signal terminal pads 23 and the signal solder bumps 25) present in the first mounting region 64. Accordingly, the microprocessor core section 61 of the IC chip 21 connected to the signal solder bumps 25 is electrically connected to the first capacitor 301 via the signal wiring lines 111. The input-side power-supply wiring line establishes electrical connection between the second capacitor 101 and a second terminal (the input-side power-supply terminal pad and the input-side power-supply solder bump) present in the second mounting region 65. Accordingly, the input section 62 of the IC chip 21 connected to the input-side power-supply solder bump is electrically connected to the second capacitor 101 via the input-side power-supply wiring line. The input-side grounding wiring line establishes electrical connection between the second capacitor 101 and a second terminal (the input-side grounding terminal pad and the input-side grounding solder bump) present in the second mounting region 65. Accordingly, the input section 62 of the IC chip 21 connected to the input-side grounding solder bump is electrically connected to the second capacitor 101 via the input-side grounding wiring line. The output-side power-supply wiring line establishes electrical connection between the second capacitor 101 and a second terminal (the output-side power-supply terminal pad and the output-side power-supply solder bump) present in the second mounting region 65. Accordingly, the output section 63 of the IC chip 21 connected to the output-side power-supply solder bump is electrically connected to the second capacitor 101 via the output-side power-supply wiring line. The output-side grounding wiring line establishes electrical connection between the second capacitor 101 and a second terminal (the output-side grounding terminal pad and the output-side grounding solder bump) present in the second mounting region 65. Accordingly, the output section 63 of the IC chip 21 connected to the output-side grounding solder bump is electrically connected to the second capacitor 101 via the output-side grounding wiring line.

Next, a method of manufacturing the wiring substrate 10 of the present embodiment will be described.

In a core substrate preparation step, an intermediate product of the core substrate 11 is fabricated beforehand by a known method.

An intermediate product of the core substrate 11 is fabricated as follows. First, there is prepared a copper clad laminate (not shown) in which copper foils are affixed on respective opposite sides of the base material 161 measuring 400 mm length×400 mm width×0.8 mm thickness. Next, the copper foils on opposite sides of the copper clad laminate are patterned and etched for forming the conductor layers 163 by, for example, a subtractive process. Specifically, after electroless copper plating, copper electroplating is performed while the electroless copper plating layers are used as common electrodes. Further, dry films are individually laminated, followed by exposure and development being performed on the dry films for patterning the dry films into predetermined patterns. In this state, unnecessary portions of the copper electroplating layers, those of the electroless copper plating layers, and those of the copper foils are etched away. Subsequently, the dry films are separated. Next, the upper and lower surfaces of the base material 161, and the conductor layers 163 are roughened. Then, epoxy resin films (80 μm thick) having an inorganic filler added thereto are thermally laminated under pressure onto the upper and lower surfaces, respectively, of the base material 161, thereby forming the sub base materials 164.

Figure 4:
[FIG. 4] View for explaining a method of fabricating the wiring substrate.

Next, the laminate of the base material 161 and the sub base materials 164 undergoes drilling by use of a router so as to form a through hole which is to become the accommodation hole portion 90, at a predetermined position. In this manner, the intermediate product of the core substrate 11 is yielded (see FIG. 4). Notably, the intermediate product of the core substrate 11 is a multi-piece core substrate configured such that a plurality of regions which are to become individual core substrates 11 are arrayed in columns and rows along planar directions.

Further, in a first capacitor preparation step, the first capacitor 301 is fabricated beforehand by a known method.

The first capacitor 301 is fabricated as follows. Ceramic green sheets are formed. A nickel paste used to form internal electrode layers is applied onto the green sheets by screen printing, followed by drying. This procedure forms power-supply internal electrode portions which are to become the power-supply internal electrode layers 341, and grounding internal electrode portions which are to become the grounding internal electrode layers 342. Next, the green sheets on which the respective power-supply internal electrode portions are formed, and the green sheets on which the respective grounding internal electrode portions are formed are laminated alternatingly together, followed by application of a pressing force in a sheet lamination direction. Thus is formed a green sheet laminate of the green sheets.

Further, a large number of the via holes 330 are formed in the green sheet laminate in such a manner as to extend through the green sheet laminate, by use of a laser beam machine. By use of an unillustrated paste injection-charging apparatus, a nickel paste used to form via conductors is charged into the via holes 330. Next, the paste is applied by printing onto the upper surface of the green sheet laminate so as to form the main-surface-side power-supply electrodes 311, the main-surface-side grounding electrodes 312, and the main-surface-side signal electrodes 313 in such a manner as to cover the upper end surfaces of conductor portions. Also, the paste is applied by printing onto the lower surface of the green sheet laminate so as to form the back-surface-side power-supply electrodes 321, the back-surface-side grounding electrodes 322, and the back-surface-side signal electrodes 323 in such a manner as to cover the lower end surfaces of the conductor portions. Subsequently, the green sheet laminate is dried, thereby hardening the electrodes 311-313, 321-323 to a certain extent. Next, the green sheet laminate is debindered, followed by firing at a predetermined temperature for a predetermined time. As a result, barium titanate, and nickel contained in the paste are sintered simultaneously, thereby yielding the ceramic sintered body 304.

Next, electroless copper plating (a thickness of about 10 μm) is performed on the electrodes 311-313, 321-323 of the yielded ceramic sintered body 304. As a result, there is completed the first capacitor 301 in which a copper plating layer is formed on the electrodes 311-313, 321-323.

In a second capacitor preparation step, the second capacitor 101 is fabricated beforehand by a known method.

The second capacitor 101 is fabricated as follows. First, a dielectric slurry is prepared by the following procedure. Barium titanate powder (dielectric powder) having an average particle size of 0.7 μm, a mixed solvent of ethanol and toluene, dispersant, and plasticizer are wet-mixed in a pot. At the point of time when the components are sufficiently mixed, an organic binder is added, followed by further mixing. This procedure yields a dielectric slurry which serves as a starting material for forming a dielectric green sheet. At this time, by means of appropriately modifying the compounding ratios of the components, the viscosity of the dielectric slurry is adjusted to about 0.5 Pa·s (viscosity in one-minute value measured at 25° C. by Viscotester VT-04, a viscometer manufactured by RION Co., Ltd, by use of No. 1 rotor at 62.5 rpm). By use of the dielectric slurry, a dielectric green sheet is formed as follows. A PET film roll having a predetermined width is prepared. The roll is set in a feed section of a casting apparatus. The dielectric slurry is cast (applied) thinly and evenly onto the upper surface of the PET film by a known method, such as doctor blade coating or lip coating. Subsequently, the dielectric slurry which has been cast in the form of a sheet is dried through application of heat by use of a heater disposed between the feed section and a take-up section of the casting apparatus, thereby forming a dielectric green sheet (a green dielectric layer which is to become the dielectric layer 104) having a thickness of 5 µm.

Also, a nickel green sheet is fabricated by substantially the same method as that for fabricating the dielectric green sheet. First, dispersant and plasticizer are added to nickel powder (metal powder) having an average particle size of 0.7 µm. To the resultant mixture, an organic binder is further added, while terpineol is used as dispersion medium, followed by further mixing. Next, by use of the resultant mixture, a nickel green sheet is formed. Specifically, a PET film roll having a predetermined width is prepared. The roll is set in a feed section of a casting apparatus. The mixture is cast thinly and evenly onto the upper surface of the PET film. Subsequently, the mixture which has been cast in the form of a sheet is dried through application of heat by use of a heater, thereby forming a nickel green sheet (a green electrode layer which is to become the nickel electrode layers 102, 103) having a thickness of 9 µm.

By use of a blanking die or the like, the dielectric green sheet and the nickel green sheet are cut into pieces each measuring 150 mm square. At this stage, since the green sheets are not hardened, blanking can be performed relatively easily. Further, occurrence of cracking can be prevented.

Next, the nickel green sheets which are to become the nickel electrode layers 102, 103 are laminated on opposite sides, respectively, of the dielectric green sheet which is to become the dielectric layer 104. Specifically, the PET-film-attached nickel green sheet is placed on one side (a side on which the PET film is absent) of the dielectric green sheet. Next, by use of a laminating apparatus, the green sheets are laminated together under pressure through application of a pressing force of 500 kgf/cm$^2$ at 80° C. After the PET film is separated from the dielectric green sheet, the PET-film-attached nickel green sheet is placed on the exposed surface of the dielectric green sheet. Next, by use of the laminating apparatus, the green sheets are laminated together through application of a pressing force of 750 kgf/cm$^2$ at 80° C.

While the PET films remain attached, laser drilling is performed on the dielectric green sheet which is to become the dielectric layer 104, and the nickel green sheets which are to become the nickel electrode layers 102, 103. As a result, the through holes 109 which extend through the dielectric green sheet and the nickel green sheets are formed before firing. Subsequently, the resultant laminate is cut into pieces each measuring 25 mm square by use of a generic cutting machine. Then, the PET films are separated, thereby yielding green laminates. The green laminates are configured such that the dielectric green sheet and the nickel green sheets are laminated together.

Next, the above-mentioned green laminate is debindered at 250° C. for 10 hours in the atmosphere and is then fired at 1,260° C. for a predetermined period of time in a reducing atmosphere. As a result, barium titanate and nickel are sintered simultaneously through application of heat, thereby yielding a sintered body (second capacitor 101) in which the first nickel electrode layer 102 having a thickness of 8 µm, the dielectric layer 104 having a thickness of 4 µm, and the second nickel electrode layer 103 having a thickness of 8 µm are laminated together in this order.

Next, an acetic acid aqueous solution is prepared such that the concentration of silane coupling agent (KBM-403, product of Shin-Etsu Chemical Co., Ltd.) is 1 wt. %. The fired second capacitor 101 is dipped in the acetic acid aqueous solution for one minute and then taken out. After rinsing excess silane coupling agent from the surface of the second capacitor 101, the second capacitor 101 is dried at 110° C. for five minutes.

In a subsequent accommodation step, first, an opening of the accommodation hole portion 90 located on a side toward the core back surface 13 is sealed with a separable adhesive tape 171. The adhesive tape 171 is supported by a support table (not shown). Next, by use of a mounting apparatus (product of Yamaha Motor Co., Ltd.), the first capacitor 301 is accommodated in the accommodation hole portion 90 in such a manner that the core main surface 12 and the capacitor main surface 302 face the same side, and the core back surface 13 and the capacitor back surface 303 face the same side (see FIG. 5). At this time, the first capacitor 301 is temporarily fixed through adhesion of the surfaces of the electrodes 321-323 to an adhesive layer of the adhesive tape 171.

Figure 5:
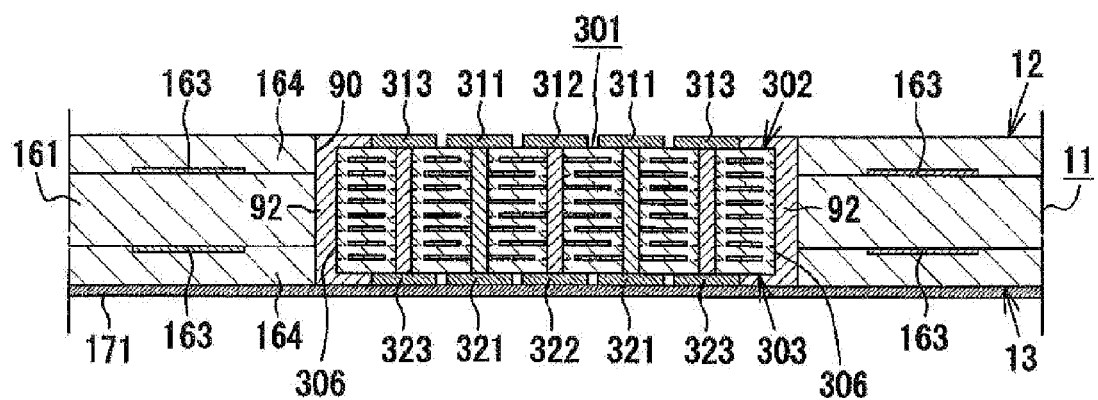
[FIG. 5] View for explaining the method of fabricating the wiring substrate.

In a subsequent charging step, by use of a dispenser apparatus (product of Asymtek), the resin filler 92 of a thermosetting resin (product of NAMICS CORPORATION) is charged into a gap between the accommodation hole portion 90 and the first capacitor 301 (see FIG. 5). In a subsequent fixing step, the first capacitor 301 is fixed in the accommodation hole portion 90 through setting of the resin filler 92. Subsequent to the fixing step, the adhesive tape 171 is separated. Subsequently, the core main surface 12 and the core back surface 13 of the core substrate 11, etc. are roughened.

Next, by use of a known method, the main-surface-side buildup layer 31 is formed on the core main surface 12, and the back-surface-side buildup layer 32 is formed on the core back surface 13. Specifically, first, photosensitive epoxy resin is applied onto the core main surface 12 and the capacitor main surface 302, and then exposure and development are performed, thereby forming the main-surface-side interlayer insulation layer 33. Also, photosensitive epoxy resin is applied onto the core back surface 13 and the capacitor back surface 303, and then exposure and development are performed, thereby forming the back-surface-side interlayer insulation layer 34. In place of photosensitive epoxy resin, insulating resin or liquid crystalline polymer (LCP) may be applied.

Figure 6:
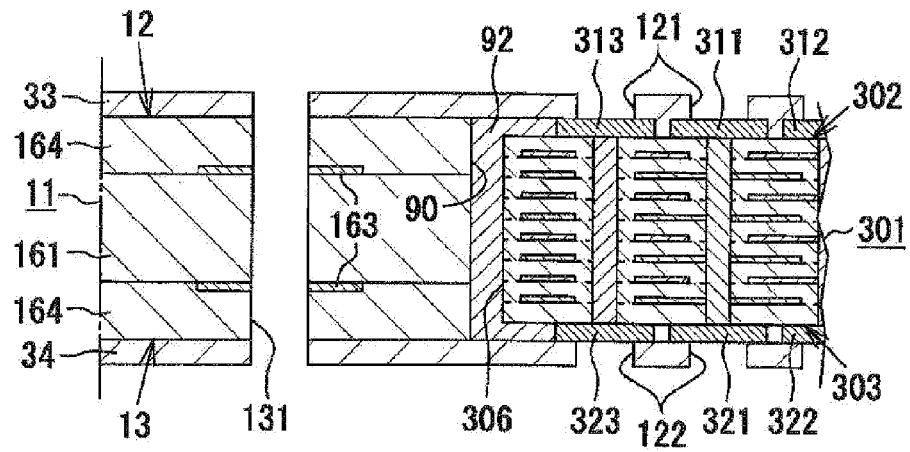
[FIG. 6] View for explaining the method of fabricating the wiring substrate.

Further, by use of YAG laser or carbon dioxide laser, laser drilling is performed so as to form via holes 121, 122 at positions where the via conductors 43 are to be formed (see FIG. 6). Specifically, the via holes 121 extending through the main-surface-side interlayer insulation layer 33 are formed, thereby exposing the surfaces of the electrodes 311-313 provided in a projecting condition on the capacitor main surface 302 of the first capacitor 301. Also, the via holes 122 extending through the back-surface-side interlayer insulation layer 34 are formed, thereby exposing the surfaces of the electrodes 321-323 provided in a projecting condition on the capacitor back surface 303 of the first capacitor 301. Further, drilling by use of a drilling machine is performed so as to form the through holes 131 at predetermined positions such that the through holes 131 extend through the core substrate 11 and the interlayer insulation layers 33, 34. Then, electroless copper plating is performed on the surfaces of the interlayer insulation layers 33, 34, the wall surfaces of the via holes 121, 122, and the wall surfaces of the through holes 131, and then etching resist is formed, followed by copper electroplating.

Figure 7:
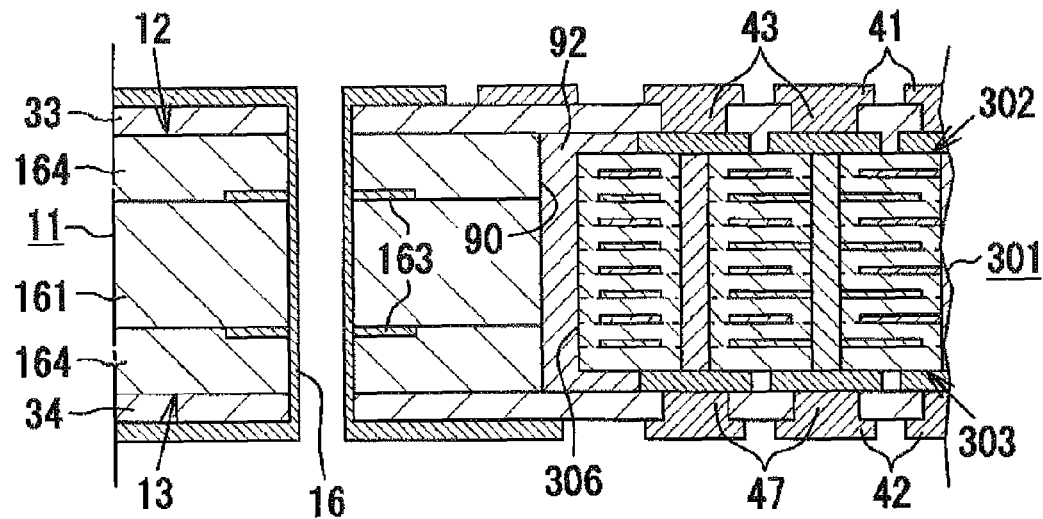
[FIG. 7] View for explaining the method of fabricating the wiring substrate.

Further, the etching resist is removed, and then soft etching is performed. By this procedure, the main-surface-side conductor layer 41 is formed in a pattern on the main-surface-side interlayer insulation layer 33, and the back-surface-side conductor layer 42 is formed in a pattern on the back-surface-side interlayer insulation layer 34 (see FIG. 7). At the same time, the through-hole conductors 16 are formed in the through holes, and the via conductors 43, 47 are formed in the via holes 121, 122, respectively. Subsequently, the cavities of the through-hole conductors 16 are filled with an insulating resin material (epoxy resin), thereby forming the blocking bodies 17.

Figure 8:
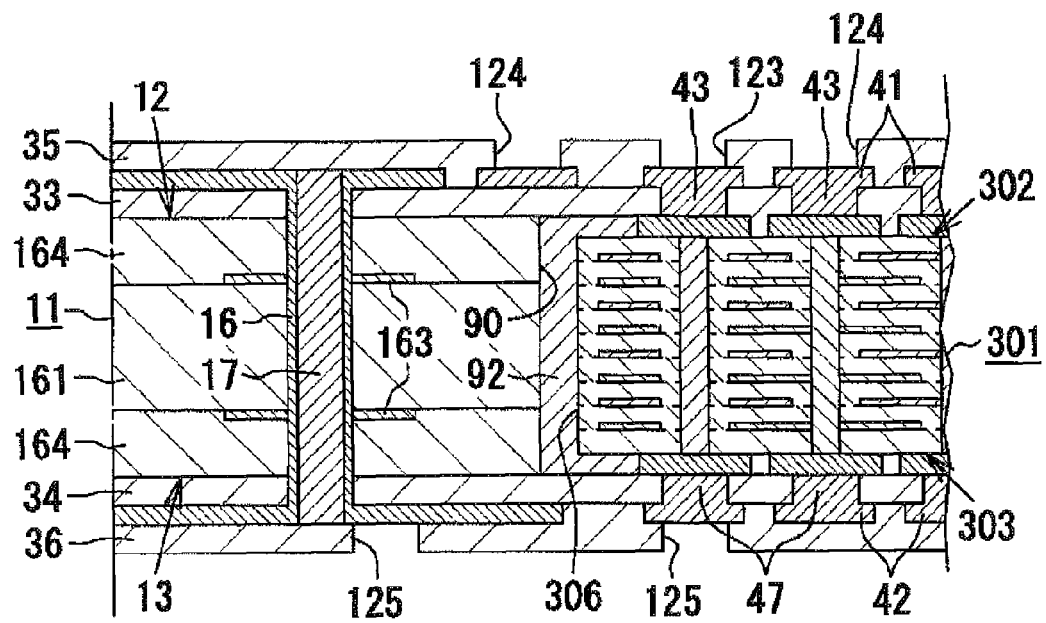
[FIG. 8] View for explaining the method of fabricating the wiring substrate.

Next, photosensitive epoxy resin is applied onto the main-surface-side interlayer insulation layer 33, and then exposure and development are performed, thereby forming the main-surface-side interlayer insulation layer 35 having via holes 123 at positions where the via conductors 43 are to be formed, and via holes 124 at positions where the via conductors 44 are to be formed (see FIG. 8). Also, photosensitive epoxy resin is applied onto the back-surface-side interlayer insulation layer 34, and then exposure and development are performed, thereby forming the back-surface-side interlayer insulation layer 36 having via holes 125 at positions where the via conductors 47 are to be formed. In place of photosensitive epoxy resin, insulating resin or liquid crystalline polymer may be applied. In this case, by use of a laser beam machine or the like, the via holes 123-125 are formed at positions where the via conductors 43, 44, 47 are to be formed. Next, a metal mask (not shown) having opening portions for exposing the via holes 124 therethrough is disposed on the main-surface-side interlayer insulation layer 35. Copper paste is applied by printing into the via holes 124 via the metal mask, thereby forming the via conductors 44. Then, the metal mask is removed. Next, after electroless copper plating is performed on the surfaces of the interlayer insulation layers 35, 36 and the wall surfaces of the via holes 123, 125, etching resist is formed, followed by copper electroplating. Further, the etching resist is remove, and then soft etching is performed. By this procedure, the via conductors 43, 47 are formed in the via holes 123, 125, respectively, and the conductor layers 41, 42 are formed in a pattern on the interlayer insulation layers 35, 36, respectively (see FIG. 9). In place of formation of the via conductors 43, 47 and the conductor layers 41, 42 after formation of the via conductors 44, the via conductors 44 may be formed after formation of the via conductors 43, 47 and the conductor layers 41, 42.

Figure 9:
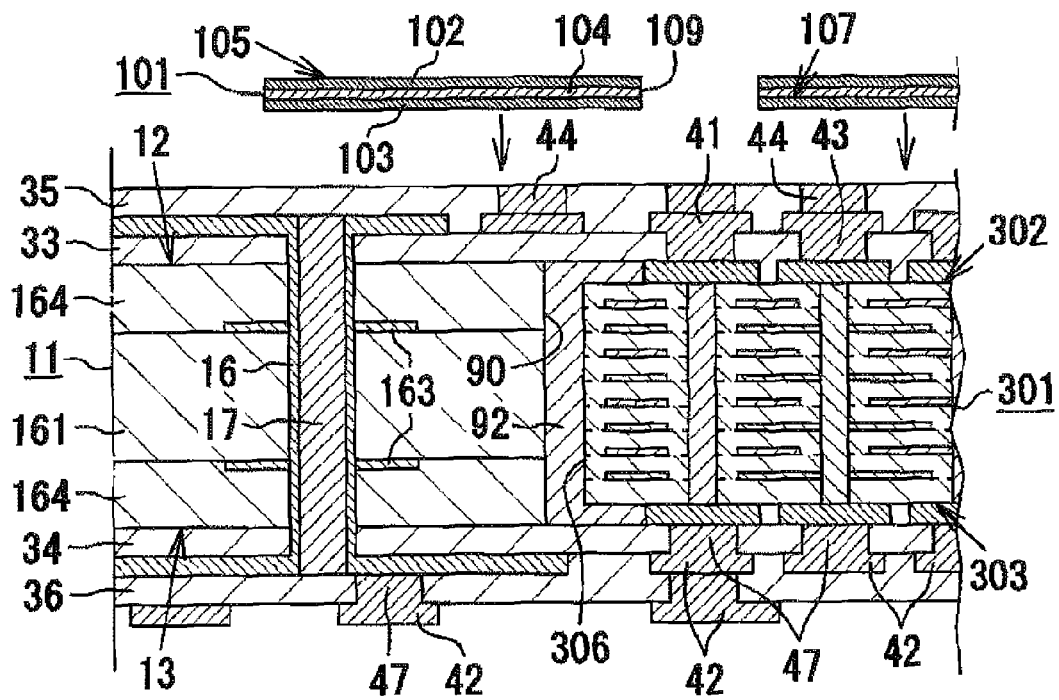
[FIG. 9] View for explaining the method of fabricating the wiring substrate.
Figure 10:
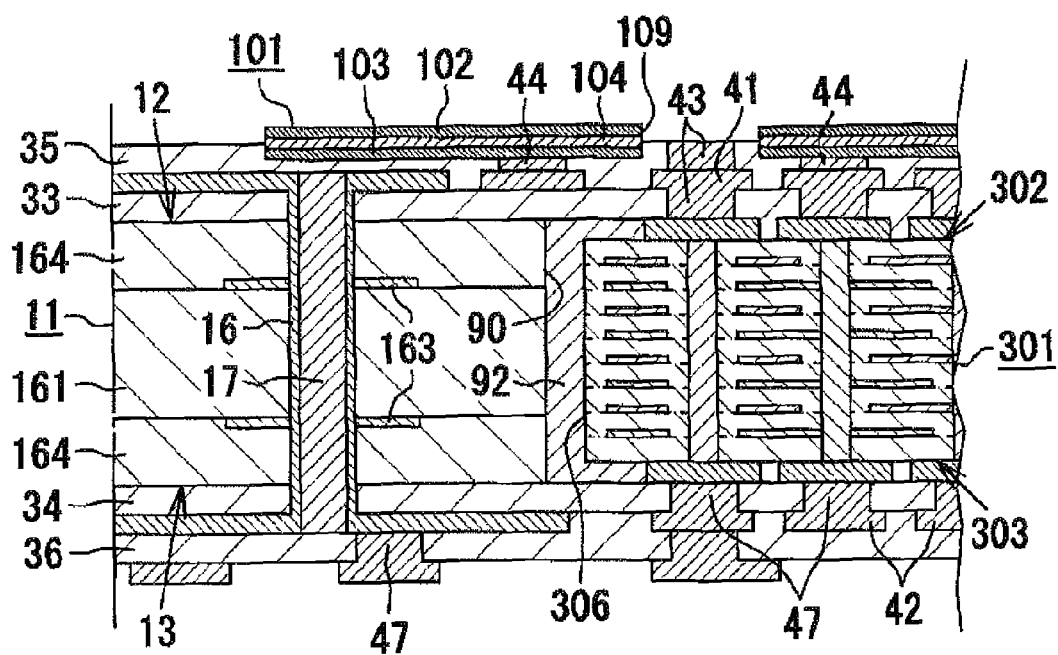
[FIG. 10] View for explaining the method of fabricating the wiring substrate.

Next, the second capacitor 101 is mounted on the second main-surface-side interlayer insulation layer 35 such that the first main surface 105 of the first nickel electrode layer 102 and the first main surface 107 of the second nickel electrode layer 103 face upward (see FIGS. 9 and 10).

More specifically, by use of a mounter having a heating mechanism, while heating is performed at 180° C. for one minute, the second capacitor 101 is mounted on the main-surface-side interlayer insulation layer 35 and subjected to pressing with a predetermined pressure. In association with this, since portions of the main-surface-side interlayer insulation layer 35 intrude into the through holes 109 of the second capacitor 101, the second capacitor 101 is reliably positioned (see FIG. 10). At this point of time, only those portions of the main-surface-side interlayer insulation layer 35 located peripherally around the second capacitor 101 are hardened. After the second capacitor 101 has been mounted, a hardening step is carried out through application of heat at 150° C. for 30 minutes, thereby hardening the main-surface-side interlayer insulation layer 35 and sintering copper contained in paste used to form the via conductors 44. By this procedure, the second capacitor 101 is fixedly supported by the second main-surface-side interlayer insulation layer 35, and the second nickel electrode layer 103 of the second capacitor 101 and the via conductors 44 are connected together.

Figure 11:
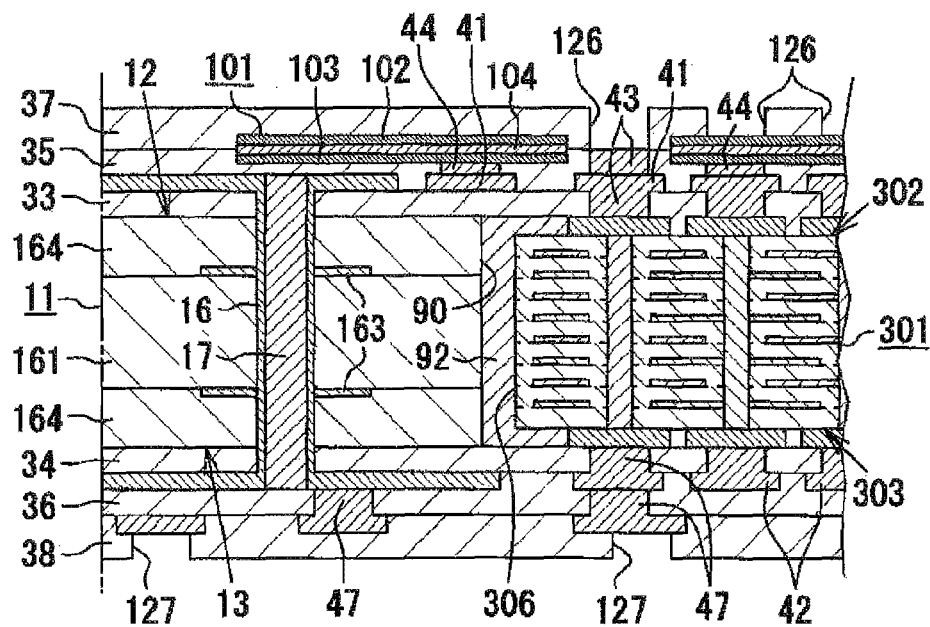
[FIG. 11] View for explaining the method of fabricating the wiring substrate.

Next, photosensitive epoxy resin is applied onto the interlayer insulation layers 35, 36, and then exposure and development are performed, thereby forming the interlayer insulation layers 37, 38 having via holes 126, 127 at positions where the via conductors 43, 47 are to be formed (see FIG. 11). In place of photosensitive epoxy resin, insulating resin or liquid crystalline polymer may be applied. In this case, by use of a laser beam machine or the like, the via holes 126, 127 are formed at positions where the via conductors 43, 47 are to be formed. At this point of time, the second capacitor 101 is completely embedded in the main-surface-side interlayer insulation layers 35, 37. Next, copper electroplating is performed according to a known method, thereby forming the via conductors 43, 47 in the via holes 126, 127. At the same time, terminal pads (specifically, the signal terminal pads 23, the power-supply terminal pads 24, the grounding terminal pads 27, the input-side power-supply terminal pad, the input-side grounding terminal pad, the output-side power-supply terminal pad, and the output-side grounding terminal pad) are formed on the main-surface-side interlayer insulation layer 37. Also, the BGA pads 48 are formed on the back-surface-side interlayer insulation layer 38.

Next, photosensitive epoxy resin is applied onto the interlayer insulation layers 37, 38 and then hardened, thereby forming the solder resists 50, 51. Next, while a predetermined mask is disposed, exposure and development are performed, whereby the solder resists 50, 51 are patterned to have opening portions 40, 46. Further, solder bumps (specifically, the signal solder bumps 25, the power-supply solder bumps 26, the grounding solder bumps 28, the input-side power-supply solder bump, the input-side grounding solder bump, the output-side power-supply solder bump, and the output-side grounding solder bump) are formed on the above-mentioned terminal pads. Also, the solder bumps 49 are formed on the BGA pads 48. Notably, the intermediate product in this state is a multi-piece wiring substrate configured such that a plurality of regions which are to become individual wiring substrates 10 are arrayed in columns and rows along planar directions. Further, by dividing the multi-piece wiring substrate, a large number of products; i.e., the wiring substrates 10, are yielded simultaneously.

Next, the IC chip 21 is mounted in the component-mounting region 20 of the main-surface-side buildup layer 31, which partially constitutes the wiring substrate 10. At this time, the surface connection terminals 22 of the IC chip 21 and the solder bumps are aligned with one another. The solder bumps are reflowed through application of heat of about 220° C. to 240° C., thereby joining the solder bumps and the surface connection terminals 22, respectively. By this procedure, the wiring substrate 10 and the IC chip 21 are electrically connected. As a result, the IC chip 21 is mounted in the component-mounting region 20 (see FIG. 1).

Thus, the present embodiment can yields the following effects.

Figure 16:
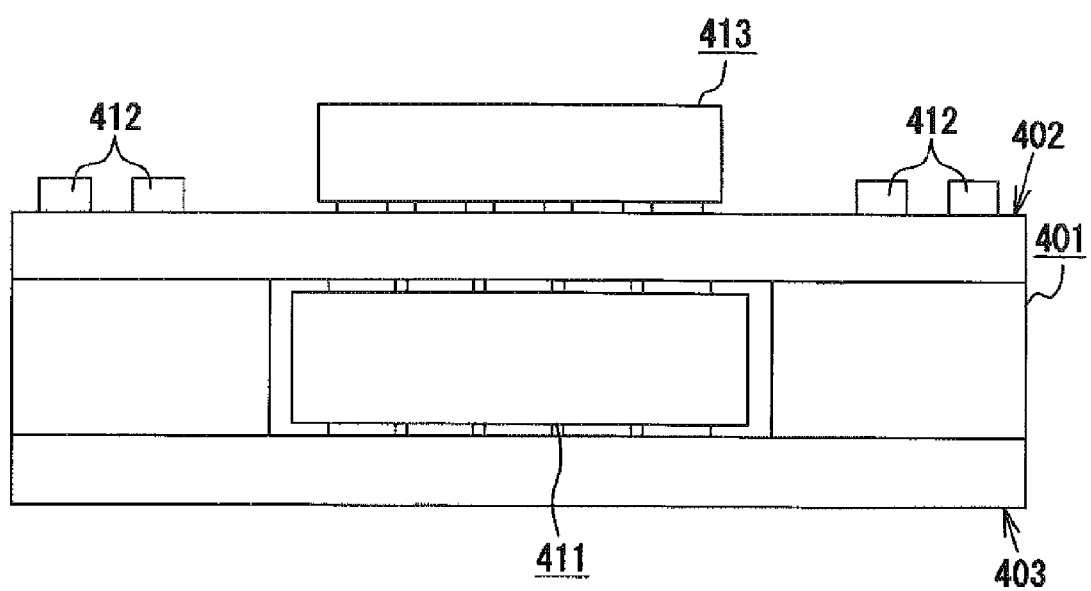
[FIG. 16] Schematic sectional view showing a conventional wiring substrate.

(1) In the conventional wiring substrate 401, capacitors (chip capacitors 412) are mounted on the surface 402 of the wiring substrate 401 (see FIG. 16). By contrast, in the wiring substrate 10 of the present embodiment, the capacitor (second capacitor 101) is embedded in the main-surface-side buildup layer 31. Thus, wiring lines that connect the capacitor and the IC chip 21 mounted in the component-mounting region 20 become shorter than in the case of conventional practice, thereby preventing an increase in an inductance component of wiring. Therefore, the second capacitor 101 can reliably reduce noise of the IC chip 21, and a power supply voltage can be reliably stabilized.

(2) In the present embodiment, both of the first capacitor 301 and the second capacitor 101 are incorporated in the wiring substrate 10, and the component-mounting region 20 is located immediately above the first capacitor 301 and the second capacitor 101. Thus, the IC chip 21 mounted in the component-mounting region 20 is supported by the first capacitor 301 and the second capacitor 101, which are high in rigidity and low in thermal expansion coefficient. Accordingly, since, in the component-mounting region 20, an associated portion of the main-surface-side buildup layer 31 is unlikely to be deformed, the IC chip 21 mounted in the component-mounting region 20 can be supported more stably. Therefore, the IC chip 21 can be prevented from suffering cracking and defective connection, which could otherwise result from high thermal stress. This enables use, as the IC chip 21, of a large-sized IC chip measuring 10 mm square or greater, which is greatly influenced by thermal stress due to an increase in stress (strain) stemming from thermal expansion difference and is subjected to severe thermal shock in the course of use due to a large amount of heat generation, and a low-k (low dielectric constant) IC chip, which is said to be fragile.

(3) Since the first capacitor 301 of the present embodiment is a via-array-type capacitor, the first capacitor 301 itself can be readily reduced in size, so that the entire wiring substrate 10 can be reduced in size. Also, since the second capacitor 101 of the present invention is a sheetlike capacitor, the second capacitor 101 itself can be reduced in thickness, so that the entire wiring substrate 10 can be reduced in thickness.

(4) In the present embodiment, the signal wiring lines 111, which electrically connect the first capacitor 301 and the IC chip 21, are disposed in the through holes 109 of the second capacitor 101. Since this configuration reduces the length of the signal wiring lines 111, noise that enters midway between the first capacitor 301 and the IC chip 21 can be suppressed to a very low level, whereby high reliability can be established without involvement of a problem such as malfunction. Also, since disposing the signal wiring lines 111 in the through holes 109 increases wiring density in the wiring substrate 10, the wiring substrate 10 can be reduced in size.

The embodiment of the present invention may be modified as follows.

In the above-mentioned embodiment, the second capacitor 101 has a plurality of through holes 109 each having a circular shape as viewed in the thickness direction of the second capacitor 101. However, no particular limitation is imposed on the number and shape of the through holes.

Figure 12:
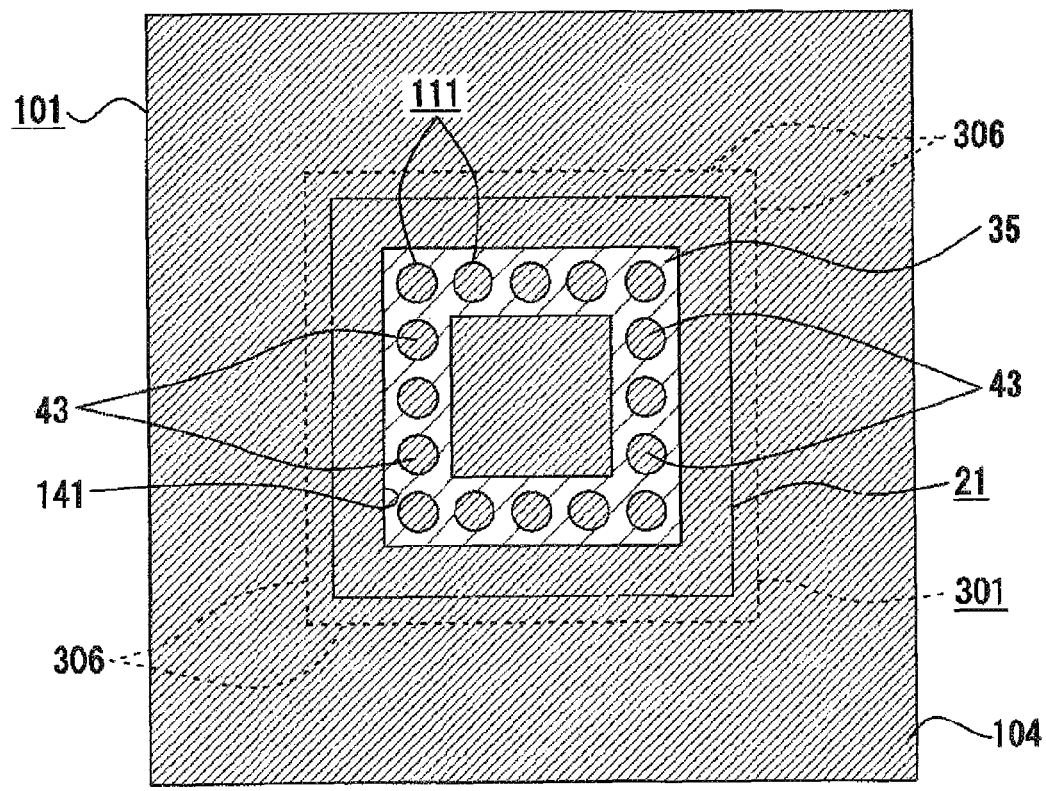
[FIG. 12] Explanatory view showing a positional relation among the first capacitor, the IC chip, etc., in another embodiment of the present invention.

For example, in the case where the second capacitor 101 is embedded in the main-surface-side buildup layer 31 at a position located toward the surface 39 of the main-surface-side buildup layer 31 so that the distance between the second capacitor 101 and the surface 39 is set shorter than that between the second capacitor 101 and the core main surface 12, the signal wiring lines 111 are in the same arrangement as that of a plurality of signal terminals (the signal terminal pads 23 and the signal solder bumps 25). For example, in the case where a plurality of signal terminals are in a closed loop arrangement, as shown in FIG. 12, the signal wiring lines 111 are also in a closed loop arrangement. In this case, preferably, a single through hole 141 having a closed loop shape as viewed form the thickness direction of the second capacitor 101 is formed in the second capacitor 101 in such a manner as to positionally coincide with the plurality of signal terminals, thereby disposing all of the signal wiring lines 111 within the through hole 141.

Figure 13:
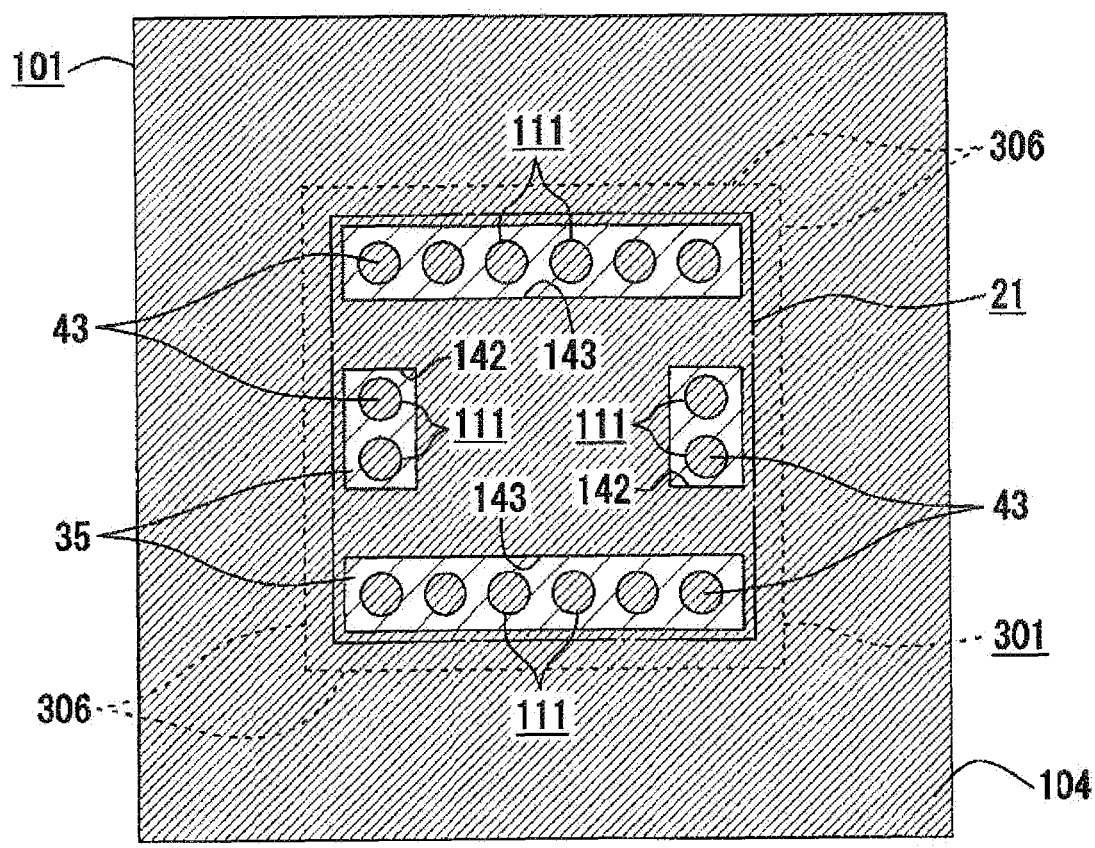
[FIG. 13] Explanatory view showing a positional relation among the first capacitor, the IC chip, etc., in a further embodiment of the present invention.

In the case where the second capacitor 101 is embedded in the main-surface-side buildup layer 31 at a position located toward the core main surface 12 so that the distance between the second capacitor 101 and the core main surface 12 is set shorter than that between the second capacitor 101 and the surface 39, the signal wiring lines 111 are disposed in such a manner as to be spaced apart from one another, since the signal wiring lines 111 are fanned out. In this case, preferably, as shown in FIG. 13, a plurality of (four in FIG. 13) through holes 142, 143 each having a rectangular shape as viewed from the thickness direction of the second capacitor 101 are formed in the second capacitor 101 in a closed loop arrangement. Preferably, a plurality of (two in FIG. 13) signal wiring lines 111 are disposed in each of the through holes 142, and a plurality of (six in FIG. 13) signal wiring lines 111 are disposed in each of the through holes 143. Since such a configuration reduces the size of the through holes 142, 143 to a minimum necessary size, the area of the second capacitor 101 can be increased accordingly, so that the capacity of the second capacitor 101 can be increased.

Figure 14:
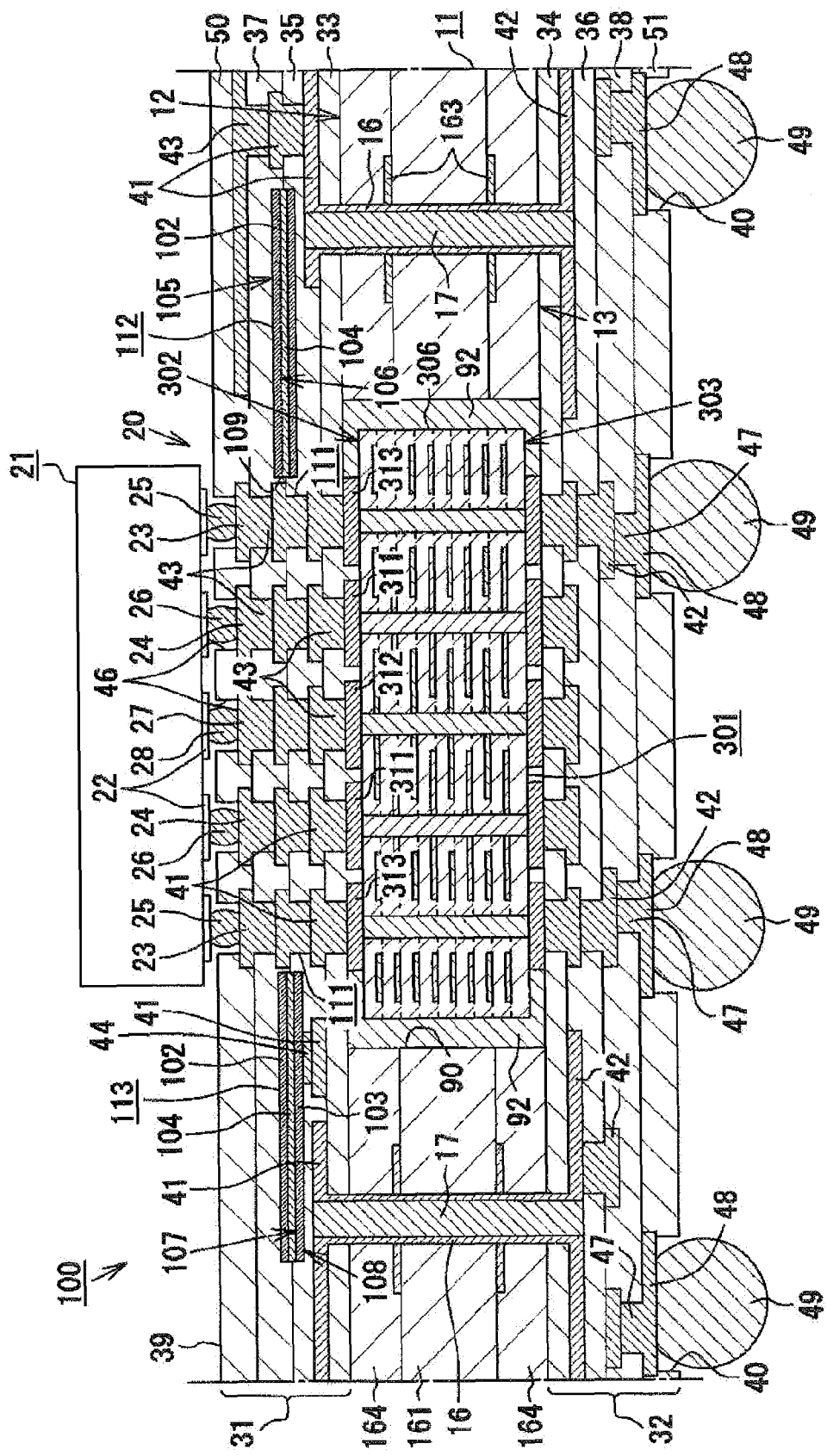
[FIG. 14] Schematic sectional view showing a wiring substrate according to a still further embodiment of the present invention.

In the wiring substrate 10 of the above-mentioned embodiment, a single second capacitor 101 is embedded in the main-surface-side buildup layer 31. However, as shown in FIG. 14, a wiring substrate 100 may be such that a plurality of (two in FIG. 14) second capacitors 112, 113 are embedded in the main-surface-side buildup layer 31. In this case, the second capacitors 112, 113 are disposed in such a manner as to avoid positionally overlapping with the signal wiring lines 111.

Figure 15:
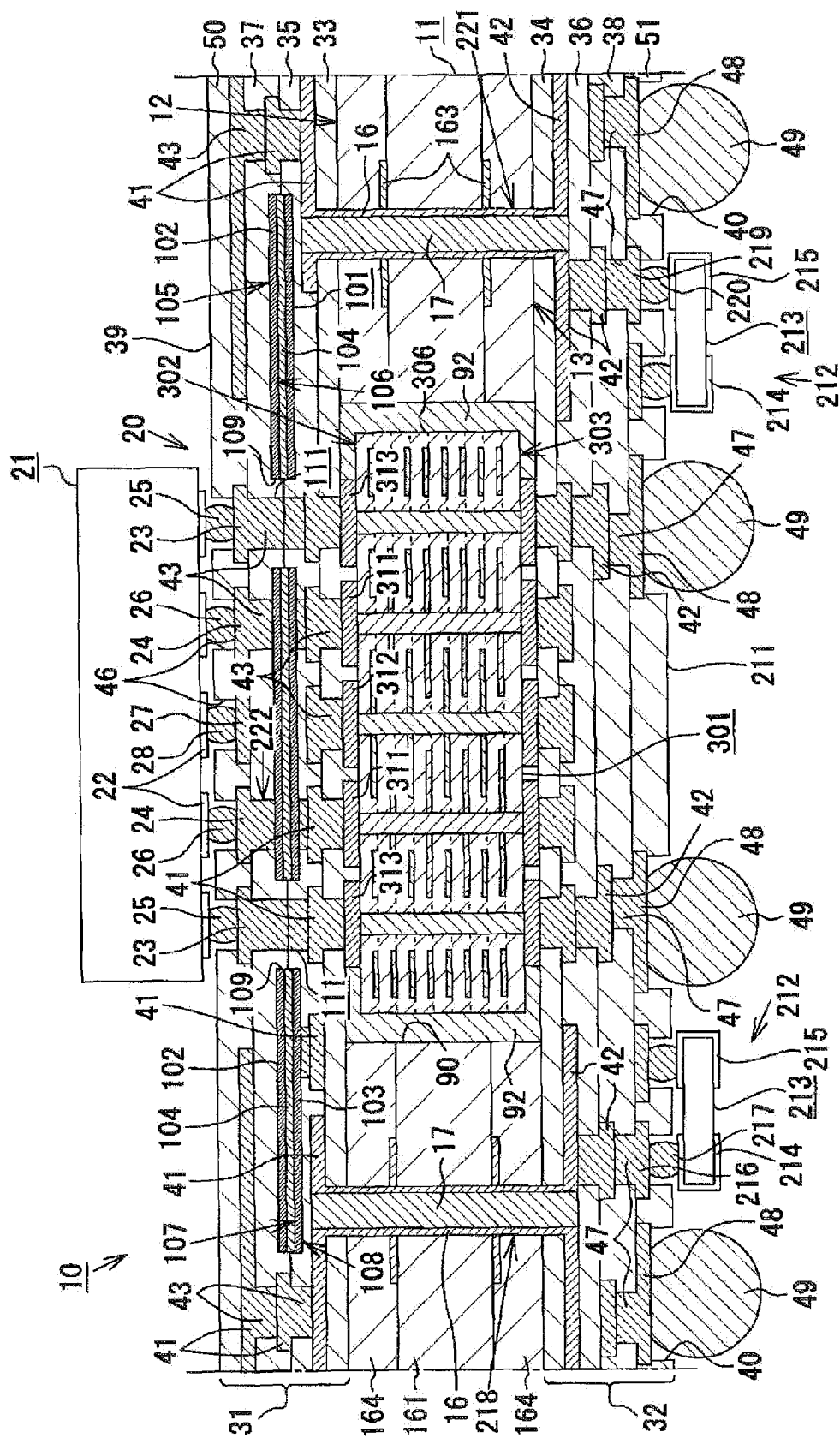
[FIG. 15] Schematic sectional view showing a wiring substrate according to yet another embodiment of the present invention.

As shown in FIG. 15, component-mounting portions 212 may be set on a surface 211 of the back-surface-side buildup layer 32 (or on the surface 39 of the main-surface-side buildup layer 31) for mounting thereon surface-mounting components, such as chip capacitors 213 and resistors (not shown). Each of the chip capacitors 213 has a structure in which, for example, power-supply internal electrode layers and grounding internal electrode layers are laminated alternatingly via dielectric layers. The chip capacitor 213 has a power-supply electrode 214 and a grounding electrode 215 provided on a pair of opposite side surfaces, respectively, the power-supply electrode 214 being connected to the power-supply internal electrode layers and a power-supply solder bump 217, the grounding electrode 215 being connected to the grounding internal electrode layers and a grounding solder bump 220.

Switching noise generated in association with high-speed ON/OFF causes a momentary drop in the electric potential of a power-supply line for the IC chip 21. Thus, as shown in FIG. 15, the first capacitor 301 may be electrically connected to a plurality of first terminals (the signal terminal pads 23) present in the first mounting region 64 via first connection conductors (signal wiring lines 111) provided in the main-surface-side buildup layer 31. Also, the second capacitor 101 may be electrically connected to a plurality of first terminals (the power-supply terminal pads 24 or the grounding terminal pads 27) present in the first mounting region 64 via first connection conductors (power-supply wiring lines 222 or grounding wiring lines) provided in the main-surface-side buildup layer 31. That is, the first capacitor 301 and the second capacitor 101 may be connected to the microprocessor core section 61 of the IC chip 21. Notably, the first capacitor 301 has the drawback that inductance is higher than that of the second capacitor 101, since a plurality of electrode layers 341, 342 are connected by means of the via conductors 331-333, but has the advantage that capacitance is larger than that of the second capacitor 101, since the number of the electrode layers 341, 342 and the dielectric layers 305 is large. By contrast, the second capacitor 101 has the drawback that capacitance is smaller than that of the first capacitor 301, since the number of the electrode layers 102, 103 and the dielectric layer 104 is small, but has the advantage that inductance is lower than that of the first capacitor 301 because of absence of the via conductors 331-333 provided in the first capacitor 301. That is, the first capacitor 301 and the second capacitor 101 function as decoupling capacitors for the IC chip 21. Through combined use of the first capacitor 301 and the second capacitor 101, the first capacitor 301 and the second capacitor 101 are in a complementary relation with each other with respect to their drawbacks. Therefore, decoupling can be performed for the IC chip 21 by means of the capacitors 101, 301, whereby a drop in the electric potential of the power-supply line can be reliably restrained.

In the above-mentioned case, connection terminals (power-supply pads 216 and power-supply solder bumps 217) present in the component-mounting portions 212 and second terminals (input-side power-supply terminal pads or output-side power-supply terminal pads) present in the second mounting region 65, which partially constitutes the component-mounting region 20, may be electrically connected via power-supply wiring lines 218. Also, connection terminals (grounding pads 219 and grounding solder bumps 220) present in the component-mounting portions 212 and second terminals (input-side grounding terminal pads or output-side grounding terminal pads) present in the second mounting region 65 may be electrically connected via grounding wiring lines 221. That is, the chip capacitors 213 can be connected to the input section 62 and the output section 63 of the IC chip 21. Notably, the power-supply wiring lines 218 and the grounding wiring lines 221 are second connection conductors provided in the core substrate 11 and the buildup layers 31, 32, and are composed of the through hole conductors 16, the conductor layers 41, 42, and the via conductors 43, 47.

In the above-mentioned embodiments, a component to be mounted in the component-mounting region 20 is the IC chip 21 having the microprocessor core section 61, the input section 62, and the output section 63. However, the component may be a DRAM, an SRAM, a chip capacitor, a register, or the like.

The second capacitor 101 of the above-mentioned embodiments has a structure in which a single dielectric layer 104 and two nickel electrode layers 102, 103 are laminated together. However, the number of the dielectric layers 104 and the nickel electrode layers 102, 103 may be changed.

Next, technological ideas that the above-mentioned embodiments implement are enumerated below.

(1) A component-incorporated wiring substrate comprising a core substrate having a core main surface and a core back surface and having an accommodation hole portion which opens at least on a side toward the core main surface; a first capacitor which has a capacitor main surface and a capacitor back surface and is accommodated in the accommodation hole portion in such a state that the core main surface and the capacitor main surface face the same side; a main-surface-side wiring laminate portion configured such that main-surface-side interlayer insulation layers and main-surface-side conductor layers are laminated alternatingly on the core main surface, and having a component-mounting region which is set on a surface of the main-surface-side wiring laminate portion and in which a component can be mounted; a back-surface-side wiring laminate portion configured such that back-surface-side interlayer insulation layers and back-surface-side conductor layers are laminated alternatingly on the core back surface; and a sheetlike second capacitor which has an electrode layer having a first main surface and a second main surface, and a dielectric layer formed on at least one of the first main surface and the second main surface of the electrode layer, is embedded in an interface between adjacent main-surface-side interlayer insulation layers in the main-surface-side wiring laminate portion in such a state that the first main surface and the second main surface are in parallel with the surface of the main-surface-side wiring laminate portion, and is disposed between the first capacitor and the component-mounting region.

(2) A component-incorporated wiring substrate comprising a core substrate having a core main surface and a core back surface and having an accommodation hole portion which opens at least on a side toward the core main surface; a first capacitor which has a capacitor main surface and a capacitor back surface and is accommodated in the accommodation hole portion in such a state that the core main surface and the capacitor main surface face the same side; a wiring laminate portion configured such that interlayer insulation layers and conductor layers are laminated alternatingly on the core main surface, and having a component-mounting region which is set on a surface of the wiring laminate portion and in which a component can be mounted; and a second capacitor which has an electrode layer having a first main surface and a second main surface, and a dielectric layer formed on at least one of the first main surface and the second main surface of the electrode layer, is embedded in the wiring laminate portion in such a state that the first main surface and the second main surface are in parallel with the surface of the wiring laminate portion, is disposed between the first capacitor and the component-mounting region, and is located such that a distance between the second capacitor and the surface of the wiring laminate portion is set shorter than that between the second capacitor and the core main surface. In the component-incorporated wiring substrate, the first capacitor and a plurality of terminals present in the component-mounting region are electrically connected via connection conductors provided in the wiring laminate portion; a plurality of signal terminals are disposed in a closed loop arrangement at a peripheral portion of the component-mounting region; the second capacitor has a through hole extending therethrough in a thickness direction thereof and formed in a closed loop in such a manner as to positionally coincide with the plurality of signal terminals; and the connection conductors are disposed in the through hole in noncontact with the wall surface of the through hole and serve as signal wiring lines for electrically connecting the first capacitor and the plurality of signal terminals.

(3) A component-incorporated wiring substrate comprising a core substrate having a core main surface and a core back surface and having an accommodation hole portion which opens at least on a side toward the core main surface; a first capacitor which has a capacitor main surface and a capacitor back surface and is accommodated in the accommodation hole portion in such a state that the core main surface and the capacitor main surface face the same side; a wiring laminate portion configured such that interlayer insulation layers and conductor layers are laminated alternatingly on the core main surface, and having a component-mounting region which is set on a surface of the wiring laminate portion and in which a component can be mounted; and a second capacitor which has an electrode layer having a first main surface and a second main surface, and a dielectric layer formed on at least one of the first main surface and the second main surface of the electrode layer, is embedded in the wiring laminate portion in such a state that the first main surface and the second main surface are in parallel with the surface of the wiring laminate portion, is disposed between the first capacitor and the component-mounting region, and is located such that a distance between the second capacitor and the core main surface is set shorter than that between the second capacitor and the surface of the wiring laminate portion. In the component-incorporated wiring substrate, the first capacitor and a plurality of terminals present in the component-mounting region are electrically connected via connection conductors provided in the wiring laminate portion; a plurality of signal terminals are disposed in a closed loop arrangement at a peripheral portion of the component-mounting region; the second capacitor has a plurality of through holes extending therethrough in a thickness direction thereof and formed in a closed loop arrangement; and the connection conductors are disposed in the through holes in noncontact with wall surfaces of the through holes and serve as signal wiring lines for electrically connecting the first capacitor and the plurality of signal terminals.

DESCRIPTION OF REFERENCE NUMERALS 10, 100: component-incorporated wiring substrate (wiring substrate)
11: core substrate
12: core main surface
13: core back surface
20: component-mounting region
21: IC chip serving as a component and a semiconductor integrated circuit device
23: signal terminal pad partially constituting a terminal, a signal terminal, and a first terminal
24: power-supply terminal pad partially constituting a first terminal
25: signal solder bump partially constituting a terminal, a signal terminal, and a first terminal
26: power-supply solder bump partially constituting a first terminal
27: grounding pad partially constituting a first terminal
28: grounding solder bump partially constituting a first terminal
31: main-surface-side build up layer serving as a wiring laminate portion and a main-surface-side wiring laminate portion
32: back-surface-side buildup layer serving as a back-surface-side wiring laminate portion
33, 35, 37: main-surface-side interlayer insulation layer serving as an interlayer insulation layer
34, 36, 38: back-surface-side interlayer insulation layer
39: surface of the wiring laminate portion and the main-surface-side wiring laminate portion
41: main-surface-side conductor layer serving as a conductor layer
42: back-surface-side conductor layer
61: microprocessor core section
62: input section
63: output section
64: first mounting region
65: second mounting region
90: accommodation hole portion
101, 112, 113: second capacitor
102: first nickel electrode layer serving as an electrode layer
103: second nickel electrode layer serving as an electrode layer
104: dielectric layer
105, 107: first main surface
106, 108: second main surface
109, 141, 142, 143: through hole
111: signal wiring line serving as a connection conductor and a first connection conductor
211: surface of the back-surface-side laminate portion
212: component-mounting portion
213: chip capacitor serving as a surface-mounting component
216: power-supply pad serving as a connection terminal
217: power-supply solder bump serving as a connection terminal
218: power-supply wiring line serving as a second connection conductor
219: grounding pad serving as a connection terminal
220: grounding solder bump serving as a connection terminal
221: grounding wiring line serving as a second connection conductor
222: power-supply wiring line serving as a first connection conductor
301: first capacitor
302: capacitor main surface
303: capacitor back surface
304: ceramic sintered body serving as a capacitor body
305: ceramic dielectric layer
311: main-surface-side power-supply electrode serving as a power-supply electrode
312: main-surface-side grounding electrode serving as a grounding electrode
321: back-surface-side power-supply electrode serving as a power-supply electrode
322: back-surface-side grounding electrode serving as a grounding electrode
331: power-supply via conductor
332: grounding via conductor
341: power-supply internal electrode layer
342: grounding internal electrode layer

The invention claimed is:
1. A component-incorporated wiring substrate comprising:
a core substrate having a core main surface and a core back surface and having an accommodation hole portion which opens at least on a side toward the core main surface;
a first capacitor which has a capacitor main surface and a capacitor back surface and is accommodated in the accommodation hole portion in such a state that the core main surface and the capacitor main surface face the same side;
a wiring laminate portion configured such that interlayer insulation layers and conductor layers are laminated alternatingly on the core main surface, and having a component-mounting region which is set on a surface of the wiring laminate portion and in which a component can be mounted; and
a second capacitor which has an electrode layer having a first main surface and a second main surface, and a dielectric layer that comprises a dielectric ceramic as a main component formed only on one or both of the first main surface and the second main surface of the electrode layer, is embedded in the wiring laminate portion in such a state that the first main surface and the second main surface are in parallel with the surface of the wiring laminate portion, and is disposed between the first capacitor and the component-mounting region;
wherein:

the first capacitor and a plurality of terminals present in the component-mounting region are electrically connected via connection conductors provided in the wiring laminate portion, the second capacitor has a through hole(s) extending therethrough in a thickness direction thereof, and the connection conductors are disposed in the through hole(s) in noncontact with the second capacitor, including the electrode layer and the dielectric layer.

2. A component-incorporated wiring substrate according to claim 1, wherein an outside dimension of the second capacitor is set greater than that of the first capacitor and that of the component-mounting region, and as viewed from a thickness direction of the component-incorporated wiring substrate, a placement region of the second capacitor encompasses that of the first capacitor and the component-mounting region.

3. A component-incorporated wiring substrate according to claim 1, wherein a plurality of signal terminals are disposed in a closed loop arrangement at a peripheral portion of the component-mounting region, the second capacitor is embedded in the wiring laminate portion at a position located toward the surface of the wiring laminate portion, the through hole is formed in a closed loop in such a manner as to positionally coincide with the plurality of signal terminals, and the connection conductors serve as signal wiring lines for electrically connecting the first capacitor and the plurality of signal terminals.

4. A component-incorporated wiring substrate according to claim 1, wherein a plurality of signal terminals are disposed in a closed loop arrangement at a peripheral portion of the component-mounting region, the second capacitor is embedded in the wiring laminate portion at a position located toward the core main surface, a plurality of the through holes are formed in a closed loop arrangement, and the connection conductors serve as signal wiring lines for electrically connecting the first capacitor and the plurality of signal terminals.

5. A component-incorporated wiring substrate according to claim 1, wherein the first capacitor and a plurality of terminals present in the component-mounting region are electrically connected via connection conductors provided in the wiring laminate portion, and a plurality of the second capacitors are embedded in the wiring laminate portion and arranged in such a manner as to avoid the connection conductors.

6. A component-incorporated wiring substrate according to claim 1, wherein the first capacitor and the second capacitor are electrically independent of each other.

7. A component-incorporated wiring substrate according to claim 1, wherein the component is a semiconductor integrated circuit device having a microprocessor core section, an input section, and an output section, the component-mounting region comprises a first mounting region connectable to the microprocessor core section, and a second mounting region connectable to the input section or the output section, the first capacitor and a plurality of first terminals present in the first mounting region are electrically connected via first connection conductors provided in the wiring laminate portion, and the second capacitor and a plurality of second terminals present in the second mounting region are electrically connected via second connection conductors provided in the wiring laminate portion.

8. A component-incorporated wiring substrate according to claim 1, wherein the first capacitor comprises:

a capacitor body having the capacitor main surface and the capacitor back surface and having a structure in which power-supply internal electrode layers and grounding internal electrode layers are laminated alternatingly via ceramic dielectric layers, a plurality of power-supply via conductors for establishing electrical communication among the power-supply internal electrode layers, a plurality of grounding via conductors for establishing electrical communication among the grounding internal electrode layers, power-supply electrodes in contact with at least end portions of the plurality of power-supply via conductors located on a side toward the capacitor main surface, and grounding electrodes in contact with at least end portions of the plurality of grounding via conductors located on the side toward the capacitor main surface; and the plurality of power-supply via conductors and the plurality of grounding via conductors are arranged in an array.

9. A component-incorporated wiring substrate according to claim 1, wherein a gap between a wall surface(s) of the through hole(s) and the connection conductors is filled with a portion of the interlayer insulation layer.

10. A component-incorporated wiring substrate according to claim 1, wherein the interlayer insulation layers include a polymeric material, and wherein the dielectric ceramic includes inorganic matter.

11. A component-incorporated wiring substrate according to claim 1, wherein the second capacitor is sandwiched between at least two of the interlayer insulation layers.

* * * * *